(12) United States Patent
Jin et al.

(10) Patent No.: US 11,798,906 B2
(45) Date of Patent: Oct. 24, 2023

(54) SEMICONDUCTOR CHIP

(71) Applicant: Samsung Electronics Co., Ltd., Suwon-si (KR)

(72) Inventors: Jeong-gi Jin, Seoul (KR); Nae-in Lee, Seoul (KR); Jum-yong Park, Yongin-si (KR); Jin-ho Chun, Seoul (KR); Seong-min Son, Hwaseong-si (KR); Ho-Jin Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/551,548

(22) Filed: Dec. 15, 2021

(65) Prior Publication Data

US 2022/0108962 A1 Apr. 7, 2022

Related U.S. Application Data

(60) Division of application No. 16/668,146, filed on Oct. 30, 2019, now Pat. No. 11,251,144, which is a
(Continued)

(30) Foreign Application Priority Data

Nov. 14, 2016 (KR) .................. 10-2016-0151306

(51) Int. Cl.
*H01L 23/00* (2006.01)
*H01L 23/31* (2006.01)
(Continued)

(52) U.S. Cl.
CPC .......... *H01L 24/05* (2013.01); *H01L 23/3157* (2013.01); *H01L 24/02* (2013.01);
(Continued)

(58) Field of Classification Search
None
See application file for complete search history.

(56) References Cited

U.S. PATENT DOCUMENTS 6,118,180 A 9/2000 Loo et al.
6,815,324 B2 11/2004 Huang et al.
(Continued)

FOREIGN PATENT DOCUMENTS

CN 102148210 A 8/2011
JP 2001-156097 A 6/2001
(Continued)

OTHER PUBLICATIONS

Office Action dated Nov. 29, 2022, issued in corresponding Chinese Patent Application No. 201711119538.4.
(Continued)

*Primary Examiner* — Nishath Yasmeen
(74) *Attorney, Agent, or Firm* — Harness, Dickey & Pierce, P.L.C.

(57) ABSTRACT

A semiconductor chip includes a semiconductor substrate including a bump region and a non-bump region, a bump on the bump region, and a passivation layer on the bump region and the non-bump region of the semiconductor substrate. No bump is on the non-bump region. A thickness of the passivation layer in the bump region is thicker than a thickness of the passivation layer in the non-bump region. The passivation layer includes a step between the bump region and the non-bump region.

19 Claims, 22 Drawing Sheets

Related U.S. Application Data continuation of application No. 15/791,709, filed on Oct. 24, 2017, now Pat. No. 10,483,224.

(51) Int. Cl.
  *H01L 25/10* (2006.01)
  *H01L 25/065* (2023.01)

(52) U.S. Cl.
  CPC .............. *H01L 24/11* (2013.01); *H01L 24/13* (2013.01); *H01L 24/14* (2013.01); *H01L 24/16* (2013.01); *H01L 25/0657* (2013.01); *H01L 25/105* (2013.01); *H01L 2224/0221* (2013.01); *H01L 2224/02126* (2013.01); *H01L 2224/02206* (2013.01); *H01L 2224/02215* (2013.01); *H01L 2224/02335* (2013.01); *H01L 2224/0401* (2013.01); *H01L 2224/05025* (2013.01); *H01L 2224/05564* (2013.01); *H01L 2224/11849* (2013.01); *H01L 2224/13013* (2013.01); *H01L 2224/13025* (2013.01); *H01L 2224/13026* (2013.01); *H01L 2224/13101* (2013.01); *H01L 2224/13144* (2013.01); *H01L 2224/13147* (2013.01); *H01L 2224/1403* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/81815* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2225/06572* (2013.01); *H01L 2225/1023* (2013.01); *H01L 2225/1058* (2013.01); *H01L 2924/10253* (2013.01); *H01L 2924/1432* (2013.01); *H01L 2924/1434* (2013.01); *H01L 2924/1438* (2013.01); *H01L 2924/15311* (2013.01); *H01L 2924/15331* (2013.01); *H01L 2924/181* (2013.01); *H01L 2924/3511* (2013.01)

(56) References Cited

U.S. PATENT DOCUMENTS

| | | |
|---|---|---|
| 8,022,555 B2 | 9/2011 | Hwang et al. |
| 8,373,275 B2 | 2/2013 | Daubenspeck et al. |
| 8,445,994 B2 | 5/2013 | Chandrasekaran |
| 8,455,999 B2 | 6/2013 | Wu et al. |
| 8,519,516 B1 | 8/2013 | Gandhi |
| 8,581,400 B2 | 11/2013 | Liang et al. |
| 8,643,147 B2 | 2/2014 | Jeng et al. |
| 8,643,180 B2 | 2/2014 | Shinkai et al. |
| 8,803,318 B2 | 8/2014 | Kulkarni et al. |
| 8,900,994 B2 | 12/2014 | Yu et al. |
| 8,987,050 B1 | 3/2015 | Hiner et al. |
| 9,087,732 B1* | 7/2015 | Xu .............. H01L 24/94 |
| 9,536,846 B2* | 1/2017 | Park .............. H01L 21/6835 |
| 2006/0014320 A1* | 1/2006 | Yamano .............. H01L 24/05 |
| | | 438/464 |
| 2007/0018322 A1 | 1/2007 | Park et al. |
| 2007/0018331 A1 | 1/2007 | Chen |
| 2008/0265410 A1 | 10/2008 | Chang et al. |
| 2009/0140244 A1 | 6/2009 | Lehr et al. |
| 2011/0115073 A1 | 5/2011 | Chen |
| 2011/0291288 A1* | 12/2011 | Wu .............. H01L 24/81 |
| | | 257/773 |
| 2012/0056315 A1 | 3/2012 | Chang et al. |
| 2012/0061832 A1 | 3/2012 | Daubenspeck et al. |
| 2012/0074579 A1* | 3/2012 | Su .............. H01L 25/0657 |
| | | 257/774 |
| 2013/0015561 A1 | 1/2013 | Chen |
| 2013/0026624 A1* | 1/2013 | Erwin .............. H01L 24/05 |
| | | 257/E21.585 |
| 2013/0093077 A1 | 4/2013 | Liang et al. |
| 2014/0014959 A1 | 1/2014 | Jeng et al. |
| 2014/0021619 A1 | 1/2014 | Huang |
| 2014/0339697 A1 | 11/2014 | Chang et al. |
| 2015/0155216 A1 | 6/2015 | Kim et al. |
| 2015/0170995 A1 | 6/2015 | Chen et al. |
| 2015/0228600 A1* | 8/2015 | Lin .............. H01L 23/3192 |
| | | 257/737 |
| 2015/0348877 A1* | 12/2015 | Huang .............. H01L 23/3185 |
| | | 257/734 |
| 2017/0092610 A1 | 3/2017 | Saito |
| 2017/0141052 A1 | 5/2017 | Pan et al. |

FOREIGN PATENT DOCUMENTS

| | | |
|---|---|---|
| JP | 2006/269971 A | 10/2006 |
| JP | 2010/232616 A | 10/2010 |
| JP | 2015/053371 A | 3/2015 |
| KR | 10-1999-0086478 A | 12/1999 |
| KR | 10-2002-0091468 A | 12/2002 |
| KR | 10-2007-0052044 A | 5/2007 |
| KR | 101393701 B1 | 5/2014 |
| KR | 10-2016-0009425 A | 1/2016 |
| TW | 200939371 A | 9/2009 |

OTHER PUBLICATIONS

Office Action dated Mar. 3, 2021, issued in corresponding Taiwanese Patent Application No. 106139214.
Notice of Allowance dated Oct. 5, 2021, issued in corresponding U.S. Appl. No. 16/668,146.
Office Action dated Jun. 1, 2023, issued in corresponding Korean Patent Application No. 10-2016-0151306.

\* cited by examiner

SEMICONDUCTOR CHIP

CROSS-REFERENCE TO RELATED APPLICATION

This application is a divisional of U.S. application Ser. No. 16/668,146, filed Oct. 30, 2019, which is a continuation of U.S. application Ser. No. 15/791,709 (now U.S. Pat. No. 10,483,224), filed Oct. 24, 2017, which claims priority under 35 U.S.C. § 119 to Korean Patent Application No. 10-2016-0151306, filed on Nov. 14, 2016, in the Korean Intellectual Property Office, the disclosure of each which is incorporated herein in its entirety by reference.

BACKGROUND

Inventive concepts relate to a semiconductor chip, and more particularly, to a semiconductor chip capable of improving reliability.

As the diameter of a semiconductor substrate (or semiconductor wafer) increases and the degree of integration of a semiconductor chip increases, reliability of semiconductor manufacturing processes or a semiconductor chip may degrade. Accordingly, efforts are being made to improve reliability of the semiconductor manufacturing processes and/or the semiconductor chip.

SUMMARY

Inventive concepts provide a semiconductor chip having improved reliability.

According to some example embodiments of inventive concepts, a semiconductor chip includes a semiconductor substrate including a bump region and a non-bump region, a bump on the bump region and the non-bump region having no bump, and a passivation layer on the bump region and the non-bump region of the semiconductor substrate. A thickness of the passivation layer at the bump region is thicker than a thickness of the passivation layer at the non-bump region, and the passivation layer includes a step between the bump region and the non-bump region.

According to some example embodiments of inventive concepts, a semiconductor chip includes a semiconductor substrate, a via, a bump, and a passivation layer. The semiconductor substrate includes a bump region and a non-bump region. The via is in the bump region. The passivation layer is on the bump region and the non-bump region of the semiconductor substrate. A thickness of the passivation layer at the bump region is thicker than a thickness of the passivation layer at the non-bump region, and the passivation layer includes a step between the bump region and the non-bump region.

According to some example embodiments of inventive concepts, a semiconductor chip includes a semiconductor substrate including a first surface opposite a second surface, a bump pad, a bump, and a passivation layer. The semiconductor substrate includes a bump region, a non-bump region, a redistribution wiring region, and a dummy region. The bump pad is on the first surface of the substrate in the bump region. The bump is on the bump pad. The non-bump region has no bump. At least one of a redistribution wiring pattern on the redistribution wiring region and a dummy pattern on the dummy region are on the first surface or the second surface of the semiconductor substrate. The passivation layer covers the bump region, the non-bump region, and the redistribution wiring and dummy regions on the first surface or the second surface of the semiconductor substrate. A thickness of the passivation layer at the bump region is thicker than a thickness of the passivation layer at the non-bump region, and the passivation layer includes a first step between the bump region and the non-bump region.

According to some example embodiments of inventive concepts, a semiconductor chip includes a semiconductor substrate including a first surface opposite a second surface, a bump connected to one of the first surface and the second surface, and a passivation layer on the semiconductor substrate. The passivation layer extends along the one of the first surface and the second surface of the semiconductor substrate. The passivation layer includes a first portion having a first thickness, a second portion having a second thickness that is less than the first thickness, and a step defining the first portion and the second portion. The first portion of the passivation layer defines a hole between the bump and the semiconductor substrate.

BRIEF DESCRIPTION OF THE DRAWINGS

Inventive concepts will be more clearly understood from the following detailed description of non-limiting embodiments taken in conjunction with the accompanying drawings in which.

DETAILED DESCRIPTION

Figure 1:
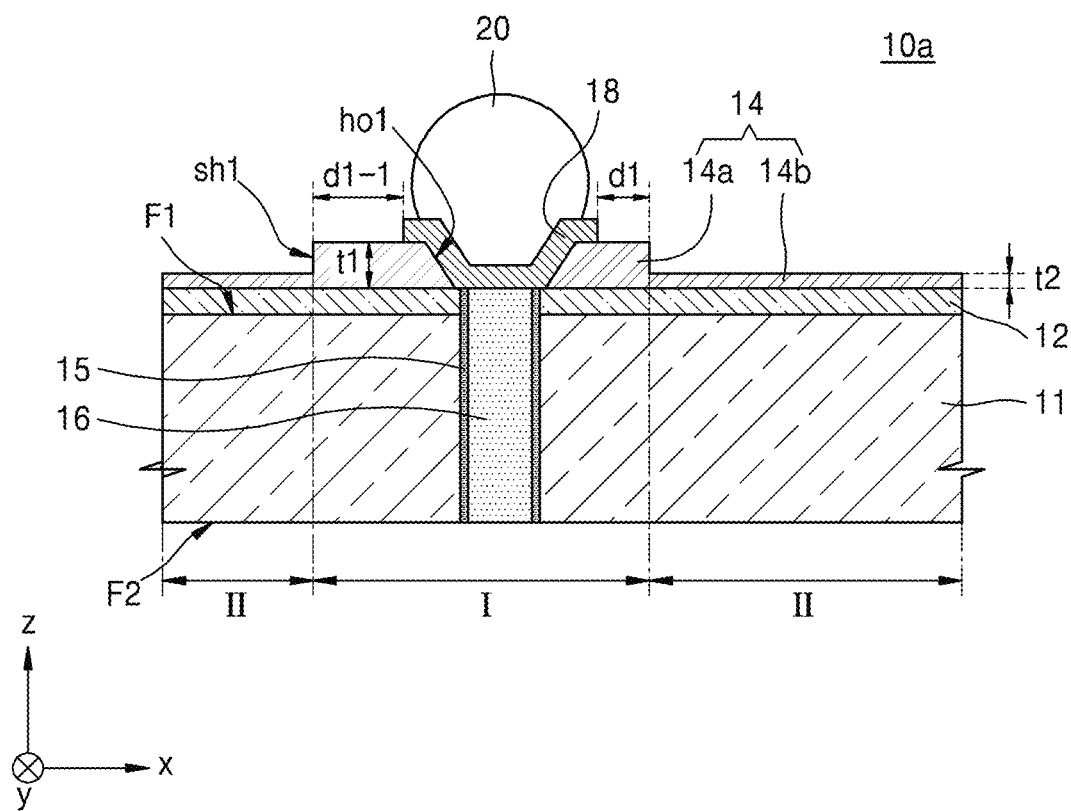
FIG. 1 is a partial cross-sectional view of a semiconductor chip according to some example embodiments of inventive concepts.

Hereinafter, some example embodiments of inventive concepts will be described in detail with reference to the accompanying drawings. Like reference numerals in the drawings denote like elements. The follow example embodiments described below may be configured independently of each other or may be combined with each other.

FIG. 1 is a partial cross-sectional view of a semiconductor chip 10a according to some example embodiments of inventive concepts.

In particular, the semiconductor chip 10a may be used in a memory chip, a non-memory chip, or an interposer. The memory chip may be a non-volatile memory chip. The memory chip may be a flash memory chip, e.g., a NAND flash memory chip or a NOR flash memory chip.

The memory chip may be Phase-change Random-Access Memory (PRAM), Magneto-resistive Random-Access Memory (MRAM), or Resistive Random-Access Memory (RRAM). The non-memory chip may be a central processing unit, multimedia semiconductor, on-demand semiconductor, or power semiconductor. The interposer may be a chip that electrically connects an upper semiconductor chip and a lower semiconductor chip to each other without including an active device.

The semiconductor chip 10a may include a semiconductor substrate 11 having a first surface F1 and a second surface F2 opposite the first surface F1. The second surface F2 may be opposite to the first surface F1 in a z-axis direction (perpendicular to a surface of the semiconductor substrate). The semiconductor substrate 11 may include a semiconductor wafer, and may include, for example, a group-IV material or a group III-V compound.

The semiconductor substrate 11 may be a single-crystalline wafer such as a silicon single-crystalline wafer. However, the semiconductor substrate 11 is not limited to a single-crystalline wafer, and various other wafers such as an Epi or Epitaxial wafer, a polished wafer, an annealed wafer, a silicon-on-insulator (SOI) wafer, may be used as the semiconductor substrate 11. Here, the Epitaxial wafer denotes a wafer, in which crystalline material is grown on a single-crystalline silicon substrate.

The semiconductor chip 10a may include a bump region I in which a bump 20 is disposed on the first surface F1 of the semiconductor substrate 11. The bump 20 included in the bump region I may be a connection terminal for electrically connecting to an external semiconductor chip or another semiconductor chip. An active region, for example, a transistor or a wiring layer, may be formed on the first surface F1 of the semiconductor substrate 11. Optionally, an active region, for example, a transistor or a wiring layer, may be formed on the second surface F2 of the semiconductor substrate 11. The bump region I may include a via 16 penetrating through the semiconductor substrate 11 and a barrier metal pad 18 formed on the via 16.

The via 16 may be a through silicon via that penetrates through the semiconductor substrate 11. The via 16 may be formed for electrically connecting to semiconductor chips located above and below the semiconductor substrate 11. Via insulating layers 15 for insulating the semiconductor substrate 11 and the via 16 from each other may be formed on opposite side walls of the via 16.

In the bump region I, the bump 20 may be formed on the barrier metal pad 18. If the bump 20 is a solder bump, the bump 20 may maintain a ball shape due to a surface tension effect after a reflow process. However, if the bump 20 is a gold (Au) bump, the bump 20 may be formed as a plated square pillar. The bump 20 may include a metal material such as solder, gold (Au), and copper (Cu).

The bump region I may include a peripheral region extending a desired (and/or alternatively predetermined) distance from opposite side walls of the bump 20 or the barrier metal pad 18. In FIG. 1, the bump region I may include a peripheral region that extends a desired (and/or alternatively predetermined) distance, for example, d1 or d1-1, from the opposite side walls of the barrier metal pad 18.

The semiconductor chip 10a may include a non-bump region II, in which the bump 20 is not disposed on the first surface F1 of the semiconductor substrate 11. The non-bump region II may be a region, except for the bump 20 and the peripheral region adjacent to the bump 20. The semiconductor chip 10a may include a lower passivation layer 12 that covers the first surface F1 of the semiconductor substrate 11, except for the via 16. The lower passivation layer 12 may be an oxide layer, a nitride layer, or a combination layer thereof.

An upper passivation layer 14 may be formed on the lower passivation layer 12, except for the via 16. The upper passivation layer 14 may be an oxide layer, a nitride layer, or a combination layer thereof. The upper passivation layer 14 may be a photo-sensitive organic layer. The photo-sensitive organic layer may be a photo-sensitive polyimide layer. The upper passivation layer 14 may be an uppermost passivation layer. A via hole ho1 exposing the via 16 may be formed in the upper passivation layer 14. The barrier metal pad 18 may be formed on the via 16 in the via hole ho1.

The upper passivation layer 14 may be divided as an upper passivation layer 14a in the bump region I and an upper passivation layer 14b in the non-bump region II. The upper passivation layer 14a in the bump region I may extend a distance d1 and a distance d1-1 respectively from a side wall and the other side wall of the barrier metal pad 18, in an x-axis direction (horizontal direction). The bump region I may include the upper passivation layer 14a that extends a distance d1 and a distance d1-1 respectively from a side wall and the other side wall of the barrier metal pad 18, in an x-axis direction (horizontal direction with respect to the surface of the semiconductor substrate 11). In FIG. 1, the y-axis direction is perpendicular to the x-axis direction, and may be parallel with the surface of the semiconductor substrate 11.

Although the distance d1 and the distance d-1 are shown not to be equal to each other in FIG. 1, the distance d1 and the distance d-1 may be equal to each other. When the upper passivation layer 14a in the bump region I extends from the side wall and the other side wall of the barrier metal pad 18, the bump 20 may be stably formed on the barrier metal pad 18.

A thickness t1 of the upper passivation layer 14a of the bump region I is thicker than a thickness t2 of the upper passivation layer 14b in the non-bump region II, and a step sh1 is formed between the bump region I and the non-bump region II. The step sh1 may be obtained by forming an upper passivation material layer (not shown) on the lower passivation layer 12, and performing a photolithography process on the upper passivation material layer by using a mask, for example, a phase shift mask.

The step sh1 may be formed simultaneously with the forming of the via hole ho1 exposing the via 16. The step sh1 may be formed perpendicular in the z-axis direction, or may be inclined by a desired (and/or alternatively predetermined) angle.

The thickness t2 of the upper passivation layer 14b in the non-bump region II is less than the thickness t1 of the upper passivation layer 14a in the bump region I, and thus, pressure applied to a semiconductor structure including the lower passivation layer 12 and the semiconductor substrate 11 is reduced and warpage of the semiconductor chip 10a may be reduced.

In particular, when the upper passivation layer 14 includes the photo-sensitive organic layer, e.g., a photo-sensitive polyimide layer, and when the thickness t2 of the upper passivation layer 14b in the non-bump region II is thinner than the thickness t1 of the upper passivation layer 14a, the pressure applied to the semiconductor structure including the lower passivation layer 12 and the semiconductor substrate 11 may be greatly reduced and the warpage of the semiconductor chip 10a may be greatly decreased.

Figure 2:
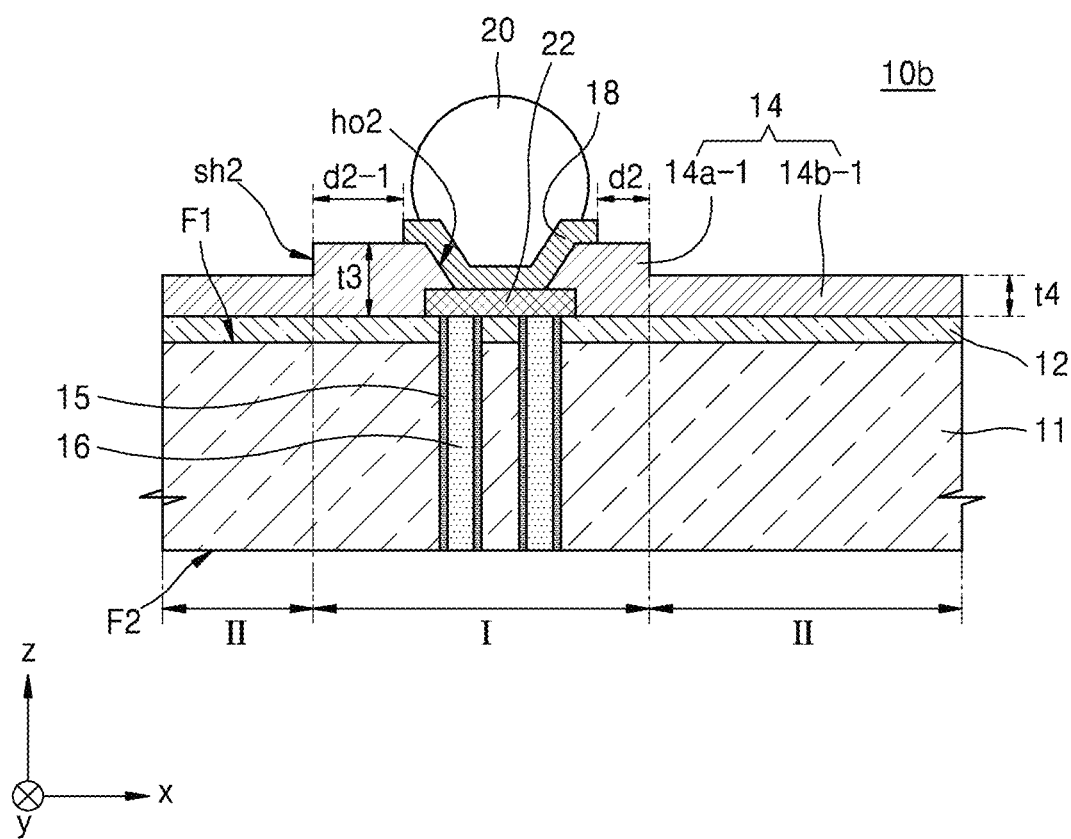
FIG. 2 is a partial cross-sectional view of a semiconductor chip according to some example embodiments of inventive concepts.

FIG. 2 is a partial cross-sectional view of a semiconductor chip 10b according to some example embodiments of inventive concepts.

The semiconductor chip 10b may be nearly the same as the semiconductor chip 10a of FIG. 1, except that the semiconductor chip 10b includes a plurality of vias 16 and a bump pad 22. Accordingly, descriptions about the same elements as those of the semiconductor chip 10a of FIG. 1 may be omitted or briefly provided.

The semiconductor chip 10b includes the plurality of vias 16 in the semiconductor substrate 11. Via insulating layers 15 for insulating the semiconductor substrate 11 and the vias 16 from each other may be formed on opposite side walls of the vias 16. Although FIG. 2 shows two vias 16, three or more vias 16 may be formed. The semiconductor chip 10b may include a bump region I in which a bump 20 is disposed on the first surface F1 of the semiconductor substrate 11.

The bump region I may include the vias 16 penetrating through the semiconductor substrate 11, the bump pad 22 formed on the vias 16, and the barrier metal pad 18 formed on the bump pad 22. The bump pad 22 may be formed on the vias 16 and the lower passivation layer 12. The bump pad 22 may be a pad connecting all of the vias 16 to one another. The bump pad 22 may be a metal pad.

The bump region I may include the bump 20 formed on the barrier metal pad 18 on the bump pad 22. The bump region I may include a peripheral region extending a desired (and/or alternatively predetermined) distance from opposite side walls of the bump 20 or the barrier metal pad 18. In FIG. 2, the bump region I may include a peripheral region that extends a desired (and/or alternatively predetermined) distance, for example, d2 or d2-1, from the opposite side walls of the barrier metal pad 18.

The semiconductor chip 10b may include the non-bump region II, in which the bump 20 is not disposed on the first surface F1 of the semiconductor substrate 11. The semiconductor chip 10b may include the lower passivation layer 12 that covers the first surface F1 of the semiconductor substrate 11, except for the vias 16. The upper passivation layer 14 may be formed on the lower passivation layer 12, except for the vias 16. A pad hole ho2 exposing the bump pad 22 may be formed in the upper passivation layer 14. The barrier metal pad 18 may be formed on the bump pad 22 in the pad hole ho2.

The upper passivation layer 14 may be divided as an upper passivation layer 14a-1 in the bump region I and an upper passivation layer 14b-1 in the non-bump region II. The upper passivation layer 14a-1 in the bump region I may extend a distance d2 and a distance d2-1 respectively from a side wall and the other side wall of the barrier metal pad 18, in the x-axis direction (horizontal direction).

Although the distance d2 and the distance d2-1 are shown not to be equal to each other in FIG. 2, the distance d2 and the distance d2-1 may be equal to each other. A thickness t3 of the upper passivation layer 14a-1 of the bump region I is thicker than a thickness t4 of the upper passivation layer 14b-1 in the non-bump region II, and a step sh2 is formed between the bump region I and the non-bump region II.

The thickness t3 of the upper passivation layer 14a-1 in the bump region I of the semiconductor chip 10b of FIG. 1 may be thicker than a thickness of the upper passivation layer 14a of the semiconductor chip 10a of FIG. 2 due to the bump pad 22. The thickness t4 of the upper passivation layer 14b-1 in the non-bump region II of the semiconductor chip 10b of FIG. 2 may be thicker than the thickness of the upper passivation layer 14b in the non-bump region II of the semiconductor chip 10a of FIG. 1, due to the bump pad 22.

The step sh2 may be obtained by forming an upper passivation material layer (not shown) on the lower passivation layer 12, and performing a photolithography process on the upper passivation material layer by using a mask, for example, a phase shift mask. The step sh2 may be formed simultaneously with the forming of the pad hole ho2 exposing the bump pad 22. The step sh2 may be formed perpendicular in the z-axis direction, or may be inclined by a desired (and/or alternatively predetermined) angle.

Figure 3:
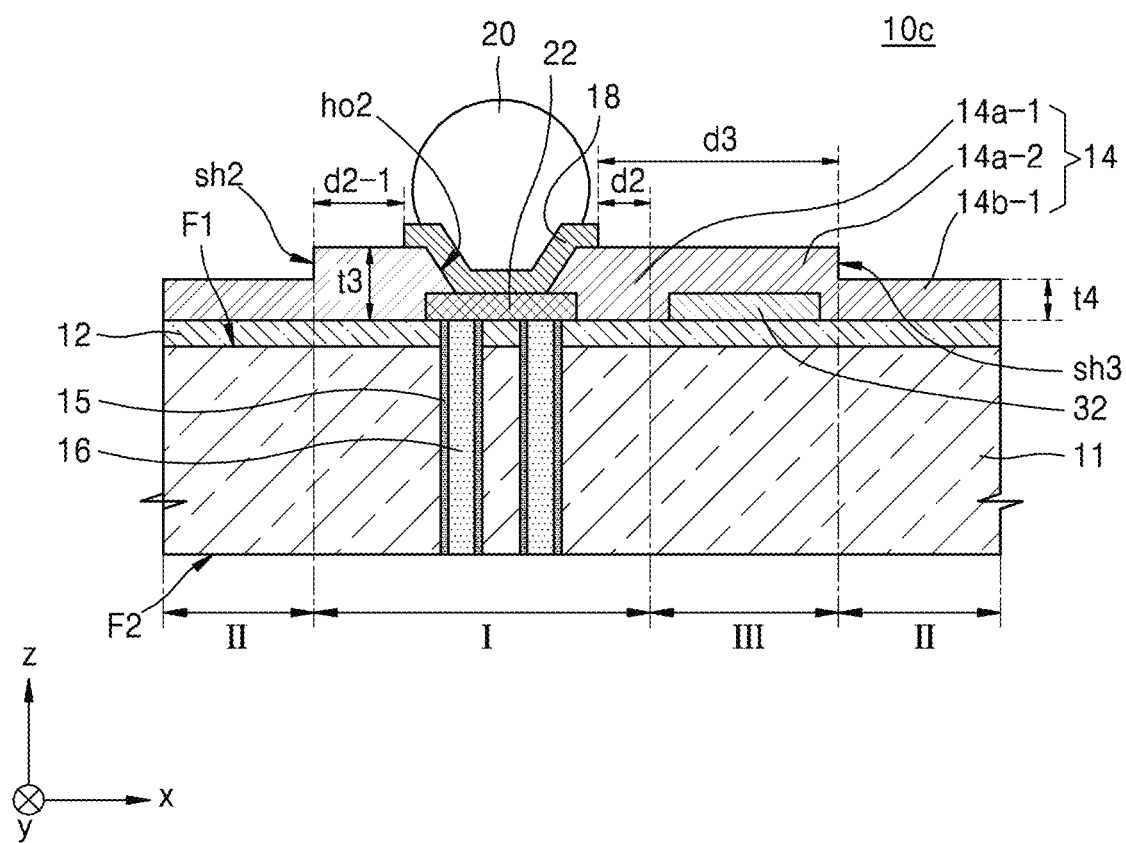
FIG. 3 is a partial cross-sectional view of a semiconductor chip according to some example embodiments of inventive concepts.

FIG. 3 is a partial cross-sectional view of a semiconductor chip 10c according to some example embodiments of inventive concepts.

In detail, the semiconductor chip 10c may be nearly the same as the semiconductor chip 10b of FIG. 2, except that the semiconductor chip 10c includes a redistribution wiring region III including a redistribution wiring pattern 32. Accordingly, descriptions about the same elements as those of the semiconductor chip 10a of FIG. 1 and the semiconductor chip 10b of FIG. 2 may be omitted or briefly provided.

The semiconductor chip 10c may include a bump region I in which a bump 20 is disposed on the first surface F1 of the semiconductor substrate 11. The bump region I may include vias 16, the bump pad 22, and the barrier metal pad 18. The semiconductor chip 10c may include the redistribution wiring region III, in which the redistribution wiring pattern 32 is formed on the lower passivation layer 12. The redistribution wiring region III may be formed at a side of the bump region I. The semiconductor chip 10c may include the non-bump region II, in which the bump 20 is not disposed on the first surface F1 of the semiconductor substrate 11.

The upper passivation layer 14 may be formed to cover the bump region I, the redistribution wiring region III, and the non-bump region II. The upper passivation layer 14 may be formed on the lower passivation layer 12 and cover the bump pad 22 and the redistribution wiring pattern 32. The upper passivation layer 14 may be divided as an upper passivation layer 14a-1 in the bump region I, an upper passivation layer 14a-2 in the redistribution wiring region III, and an upper passivation layer 14b-1 in the non-bump region II.

The upper passivation layers 14a-1 and 14a-2 in the bump region I and the redistribution wiring region III may extend a distance d3 from a side wall of the barrier metal pad 18 in the x-axis direction (horizontal direction). The upper passivation layer 14a-1 in the bump region I may extend a distance d2-1 from the other side wall of the barrier metal pad 18 in a −x direction (horizontal direction).

The thickness t3 of the upper passivation layers 14a-1 and 14a-2 in the bump region I and the redistribution wiring region III may be thicker than the thickness t4 of the upper passivation layer 14b-1 in the non-bump region II, and a step sh3 is formed between the redistribution wiring region III and the non-bump region II, and the step sh2 is formed between the bump region I and the non-bump region II.

The thickness t3 of the upper passivation layers 14a-1 and 14a-2 in the bump region I and the redistribution wiring region III of the semiconductor chip 10c of FIG. 3 may be thicker than the thickness of the upper passivation layer 14a in the semiconductor chip 10a of FIG. 1 due to the bump pad 22 and the redistribution wiring pattern 32. The thickness t4 of the upper passivation layer 14b-1 in the non-bump region II of the semiconductor chip 10c of FIG. 3 may be thicker than the thickness of the upper passivation layer 14b in the non-bump region II of the semiconductor chip 10a of FIG. 1 due to the bump pad 22 and the redistribution wiring pattern 32.

The steps sh2 and sh3 may be obtained by forming an upper passivation material layer (not shown) on the lower passivation layer 12, and performing a photolithography on the upper passivation material layer by using a mask, for example, a phase shift mask. The steps sh2 and sh3 may be formed simultaneously with the forming of the pad hole ho2 exposing the bump pad 22. The steps sh2 and sh3 may be formed perpendicular in the z-axis direction, or may be inclined by a desired (and/or alternatively predetermined) angle.

Figure 4:
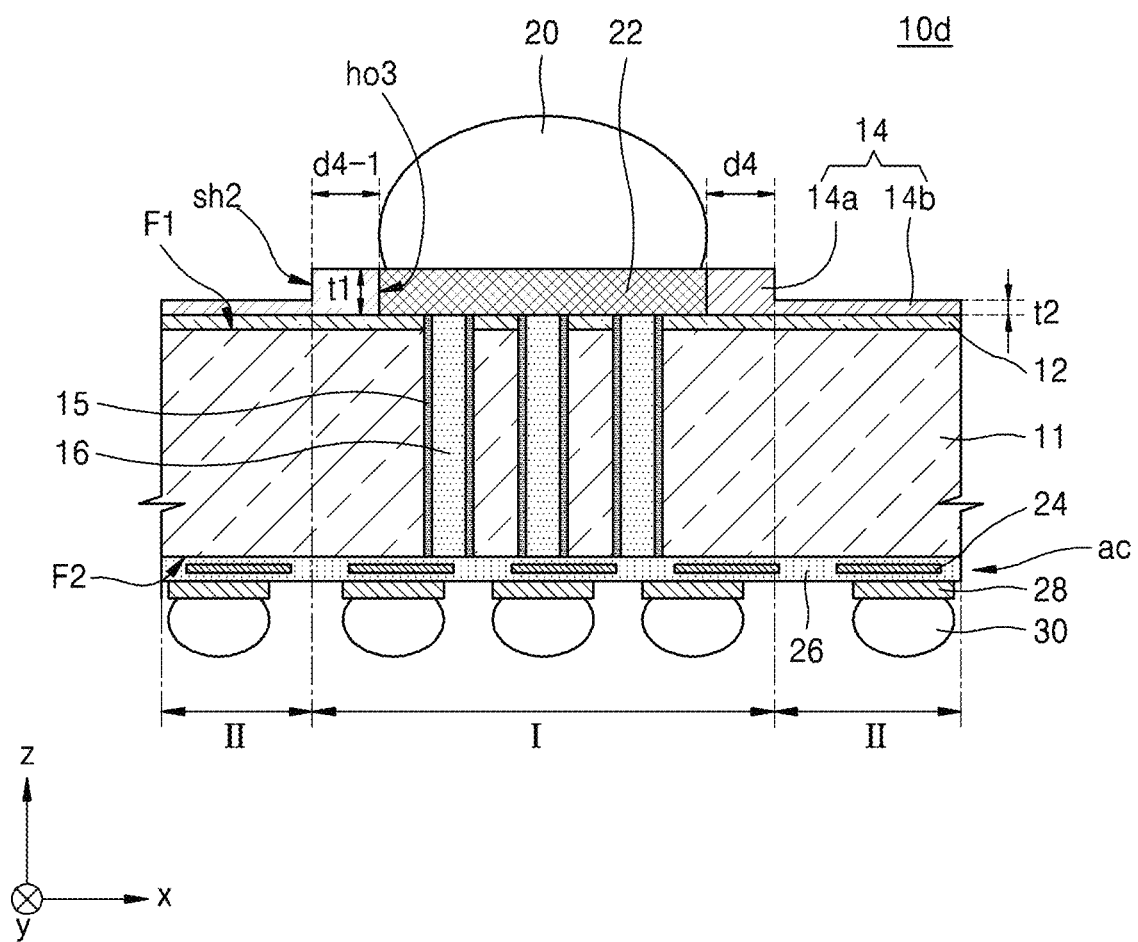
FIG. 4 is a partial cross-sectional view of a semiconductor chip according to some example embodiments of inventive concepts.

FIG. 4 is a partial cross-sectional view of a semiconductor chip 10d according to some example embodiments of inventive concepts.

In detail, the semiconductor chip 10d may be similar to the semiconductor chip 10a of FIG. 1 except that the semiconductor chip 10d includes the plurality of vias 16 and the bump pad 22 on the first surface F1 of the semiconductor substrate 11 and includes an active region ac, a connection pad 28, and an external connection terminal 30 on the second surface F2 of the semiconductor substrate 11. Accordingly, descriptions about the same elements as those of the semiconductor chip 10a of FIG. 1 may be omitted or briefly provided.

The semiconductor chip 10d includes the plurality of vias 16 in the semiconductor substrate 11. Via insulating layers 15 for insulating the semiconductor substrate 11 and the vias 16 from each other may be formed on opposite side walls of the vias 16. Although FIG. 4 shows three vias 16, four or more vias 16 may be formed. The semiconductor chip 10d may include a bump region I in which a bump 20 is disposed on the first surface F1 of the semiconductor substrate 11.

The bump region I may include the vias 16 penetrating through the semiconductor substrate 11 and the bump pad 22 formed on the vias 16. The bump pad 22 may be formed on the vias 16 and the lower passivation layer 12. The bump pad 22 may be a pad connecting all of the vias 16 to one another. The bump pad 22 may be a metal pad.

Unlike the example illustrated in FIG. 1, the bump 20 may be formed on the bump pad 22 in the bump region I. The bump region I may include a peripheral region extending a desired (and/or alternatively predetermined) distance from opposite side walls of the bump 20 or the bump pad 22. In FIG. 4, the bump region I may include a peripheral region that extends a desired (and/or alternatively predetermined) distance, for example, d4 or d4-1, from the opposite side walls of the bump 20.

The semiconductor chip 10d may include the non-bump region II, in which the bump 20 is not disposed on the first surface F1 of the semiconductor substrate 11. The semiconductor chip 10d may include the lower passivation layer 12 that covers the first surface F1 of the semiconductor substrate 11, except for the vias 16. The upper passivation layer 14 may be formed on the lower passivation layer 12, except for the vias 16. A via hole ho3 exposing the vias 16 may be formed in the upper passivation layer 14. The bump pad 22 and the bump 20 may be formed in the via hole ho3.

In FIG. 4, a thickness of the bump pad 22 is shown to be equal to that of the upper passivation layer 14a. However, optionally, the bump pad 22 may be formed to be thinner in thickness. In addition, the bump 20 may have various ball type shapes according to the reflow process as described above, in a case where the bump 20 is a solder bump.

The upper passivation layer 14 may be divided as an upper passivation layer 14a in the bump region I and an upper passivation layer 14b in the non-bump region II. The upper passivation layer 14a in the bump region I may extend a distance d4 and a distance d4-1 respectively from a side wall and the other side wall of the bump 20 in the x direction (horizontal direction). Although the distance d4 and the distance d4-1 are shown not to be equal to each other in FIG. 4, the distance d4 and the distance d4-1 may be equal to each other.

A thickness t1 of the upper passivation layer 14a of the bump region I is thicker than a thickness t2 of the upper passivation layer 14b in the non-bump region II, and a step sh2 is generated between the bump region I and the non-bump region II. The step sh2 may be obtained by forming an upper passivation material layer (not shown) on the lower passivation layer 12, and performing a photolithography process on the upper passivation material layer by using a mask, for example, a phase shift mask. The step sh2 may be formed simultaneously with the forming of the via hole ho3 exposing the vias 16.

The active region ac including a wiring layer 24 and an interlayer insulating layer 26 may be formed on the second surface F2 of the semiconductor substrate 11. FIG. 4 only shows the wiring layer 24 and the interlayer insulating layer 26 as the active region ac, for convenience of description. The connection pads 28 and the external connection terminals 30 may be formed on the active region ac. The semiconductor chip 10d may be mounted on an external circuit board, e.g., a printed circuit board, via the external connection terminals 30.

Figure 5:
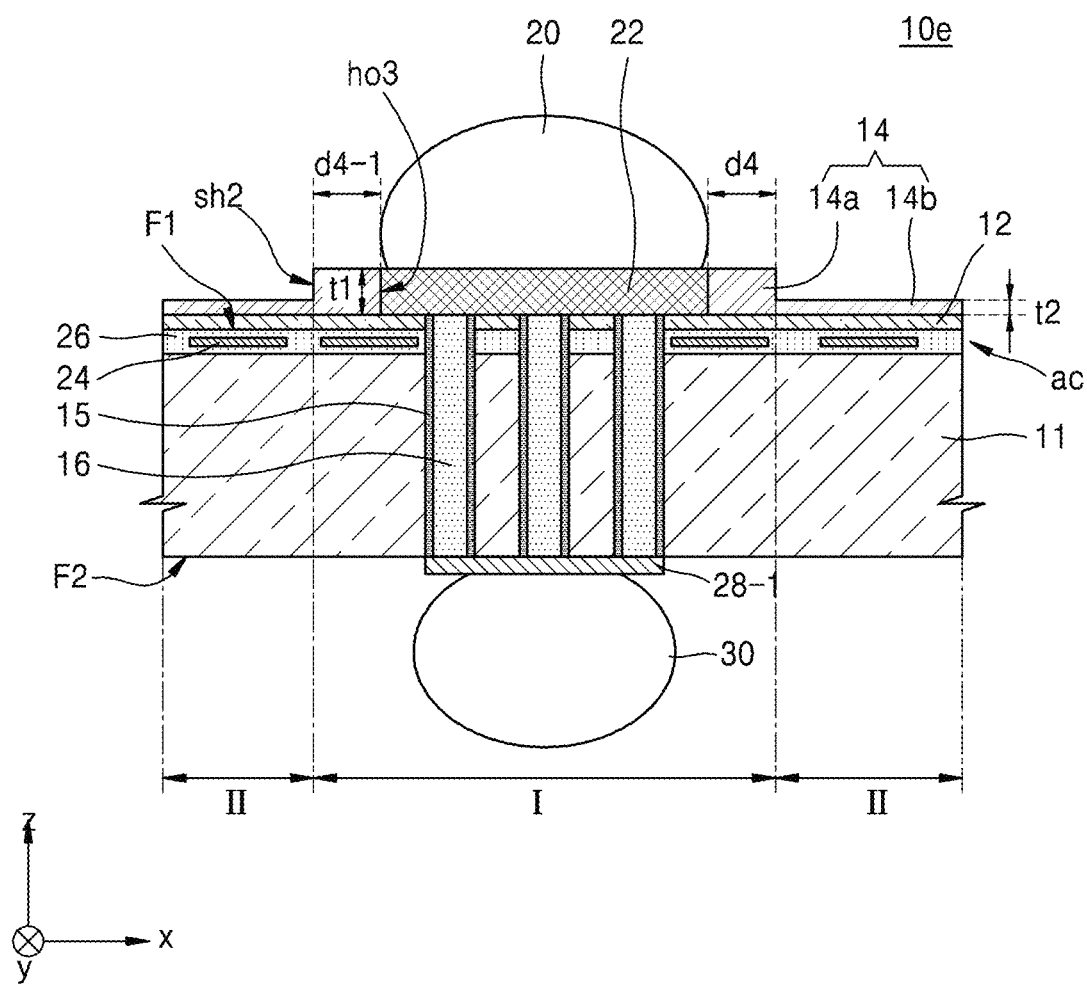
FIG. 5 is a partial cross-sectional view of a semiconductor chip according to some example embodiments of inventive concepts.

FIG. 5 is a partial cross-sectional view of a semiconductor chip 10e according to some example embodiments of inventive concepts.

In detail, the semiconductor chip 10e may be similar to the semiconductor chip 10d of FIG. 4, except that the active region ac is formed on the first surface F1 of the semiconductor substrate 11 and a connection pad 28-1 connecting the plurality of vias 16 to one another is formed on the second surface F2 of the semiconductor substrate 11. Accordingly, descriptions about the same elements as those of the semiconductor chips 10a and 10d of FIGS. 1 and 4 will be omitted or briefly provided.

The semiconductor chip 10e includes the plurality of vias 16 in the semiconductor substrate 11. The active region ac including the wiring layer 24 and the interlayer insulating layer 26 may be formed on the first surface F1 of the semiconductor substrate 11. The semiconductor chip 10e may include the connection pad 28-1 for connecting the plurality of vias 16 on the second surface F2 of the semiconductor substrate 11. An external connection terminal 30, e.g., a solder bump, may be formed on the connection pad 28-1. The semiconductor chip 10e may be mounted on an external circuit board, e.g., a printed circuit board, via the external connection terminals 30.

Figure 6:
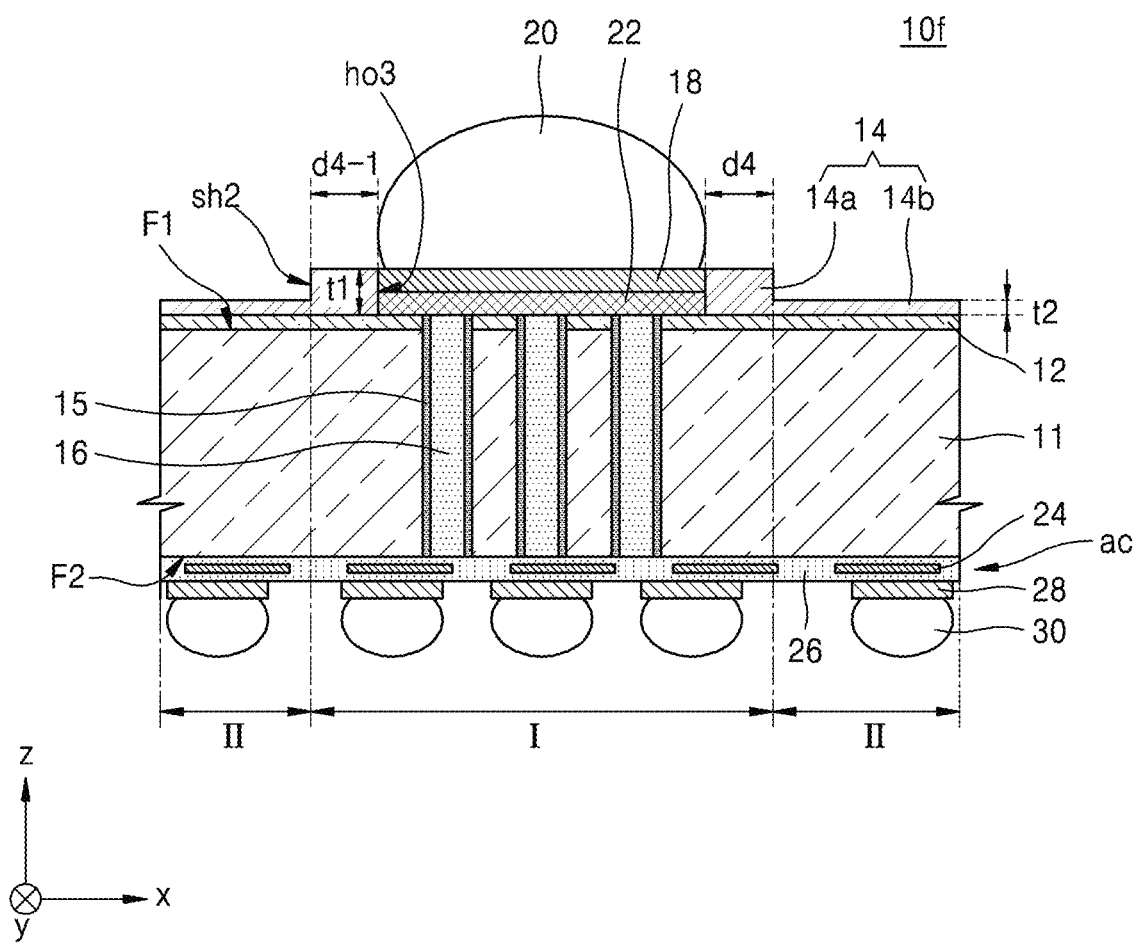
FIG. 6 is a partial cross-sectional view of a semiconductor chip according to some example embodiments of inventive concepts.

FIG. 6 is a partial cross-sectional view of a semiconductor chip 10f according to some example embodiments of inventive concepts.

In detail, the semiconductor chip 10f may be the same as the semiconductor chip 10d of FIG. 4, except that the barrier metal pad 18 is further formed in the via hole ho3. Accordingly, descriptions about the same elements as those of the semiconductor chips 10a and 10d of FIGS. 1 and 4 will be omitted or briefly provided.

The semiconductor chip 10e includes the plurality of vias 16 in the semiconductor substrate 11. The upper passivation layer 14 may be formed on the lower passivation layer 12, except for the vias 16, on the first surface F1 of the semiconductor substrate 11. A via hole ho3 exposing the vias 16 may be formed in the upper passivation layer 14. The bump pad 22 and the barrier metal pad 18 may be formed in the via hole ho3. The bump pad 22 may be a pad connecting the plurality of vias 16. The bump region I may be defined by forming the bump 20 on the barrier metal pad 18.

The active region ac including the wiring layer 24 and the interlayer insulating layer 26 may be formed on the second surface F2 of the semiconductor substrate 11. The connection pad 28 and the external connection terminal 30 may be formed in the active region ac on the second surface F2 of the semiconductor substrate 11.

Figure 7:
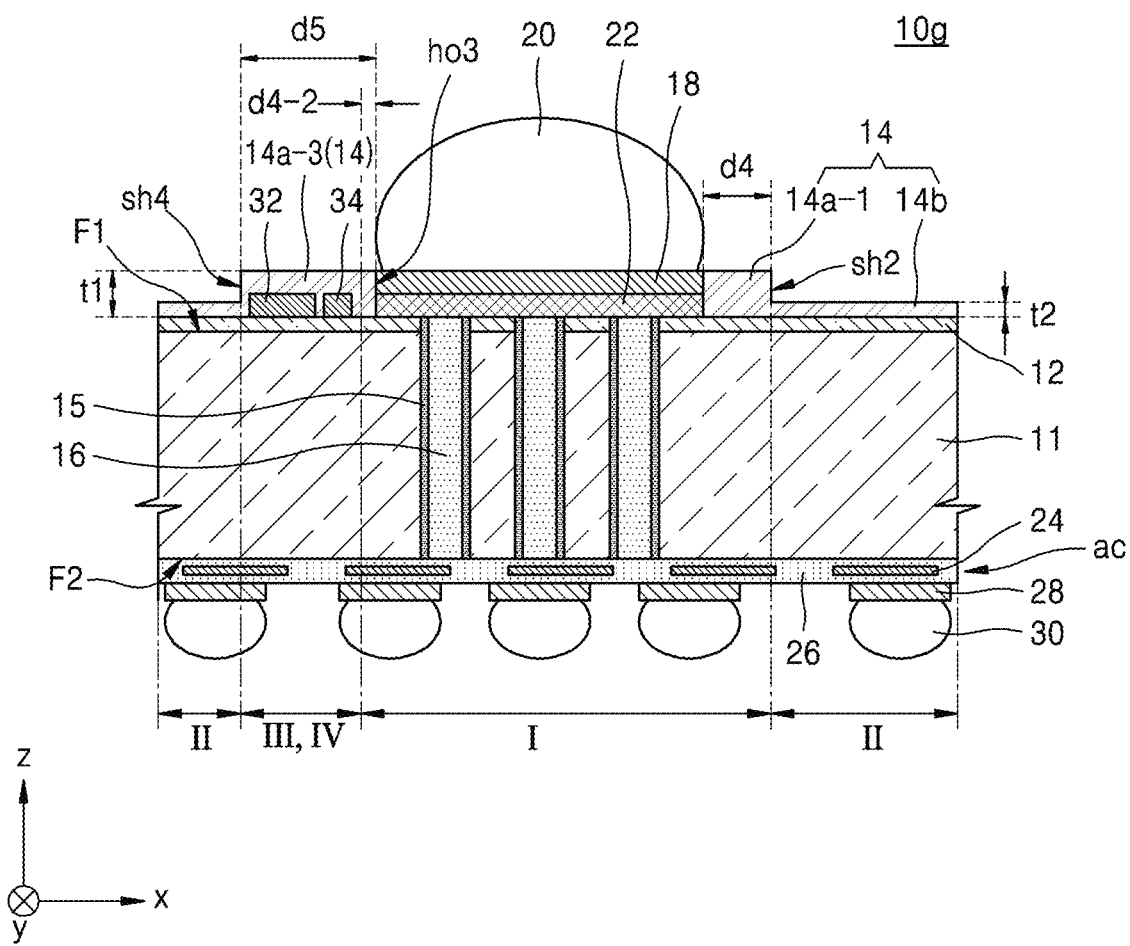
FIG. 7 is a partial cross-sectional view of a semiconductor chip according to some example embodiments of inventive concepts.

FIG. 7 is a partial cross-sectional view of a semiconductor chip 10g according to some example embodiments of inventive concepts.

In detail, the semiconductor chip 10g may be the same as the semiconductor chip 10f of FIG. 6, except that the semiconductor chip 10g includes redistribution wiring and dummy regions III and IV having the redistribution wiring pattern 32 and a dummy pattern 34. Descriptions about the same elements as those of the semiconductor chip 10f of FIG. 6 will be omitted or briefly provided.

In FIG. 7, the redistribution wiring and dummy regions III and IV including the redistribution wiring pattern 32 and the dummy pattern 34 are shown. However, if only one of the redistribution wiring pattern 32 and the dummy pattern 34 is included, the semiconductor chip 10g may only include one of the redistribution wiring and dummy regions III and IV.

The semiconductor chip 10g may include a bump region I in which a bump 20 is disposed on the first surface F1 of the semiconductor substrate 11. The bump region I may include vias 16, the bump pad 22, and the barrier metal pad 18. The semiconductor chip 10g may include the redistribution wiring and dummy regions III and IV, in which the redistribution wiring pattern 32 and the dummy pattern 34 are formed on the lower passivation layer 12. A plurality of redistribution wiring patterns 32 and a plurality of dummy patterns 34 may be formed.

The redistribution wiring and dummy regions III and IV may be formed at a side of the bump region I. The upper passivation layer 14 may be formed to cover the semiconductor substrate 11 in the bump region I, the redistribution wiring and the dummy regions III and IV, and the non-bump region II. The upper passivation layer 14 may be formed to cover the redistribution wiring patterns 32 and the dummy patterns 34 on the lower passivation layer 12. The upper passivation layer 14 may be divided as the upper passivation layer 14a-1 in the bump region I, an upper passivation layer 14a-3 in the redistribution wiring and dummy regions III and IV, and the upper passivation layer 14b in the non-bump region II.

The upper passivation layer 14a-1 in the bump region I may extend a distance d4 from a side wall of the bump 20 in the x-direction (horizontal direction). The upper passivation layer 14a-1 in the bump region I may extend a distance d4-2 from the other side wall of the bump 20 in the −x direction (horizontal direction). The upper passivation layer 14a-3 in the redistribution wiring and dummy regions III and IV may extend a distance d5 from the other side wall of the bump 20 in the −x direction (horizontal direction).

The thickness t1 of the upper passivation layers 14a-1 and 14a-3 in the bump region I and the redistribution wiring and dummy regions III and IV is thicker than the thickness t2 of the upper passivation layer 14b in the non-bump region II, and a step sh4 is generated between the redistribution wiring and dummy regions III and IV and the non-bump region II and the step sh2 is generated between the bump region I and the non-bump region II.

The steps sh2 and sh4 may be obtained by forming an upper passivation material layer (not shown) on the lower passivation layer 12, and performing a photolithography on the upper passivation material layer by using a mask, for example, a phase shift mask. The steps sh2 and sh4 may be formed simultaneously with the forming of the via hole ho3 exposing the vias 16. The steps sh2 and sh4 may be formed perpendicular in the z-axis direction, or may be inclined by a desired (and/or alternatively predetermined) angle.

The active region ac including the wiring layer 24 and the interlayer insulating layer 26 may be formed on the second surface F2 of the semiconductor substrate 11. The connection pad 28 and the external connection terminal 30 may be formed in the active region ac on the second surface F2 of the semiconductor substrate 11.

Figure 8:
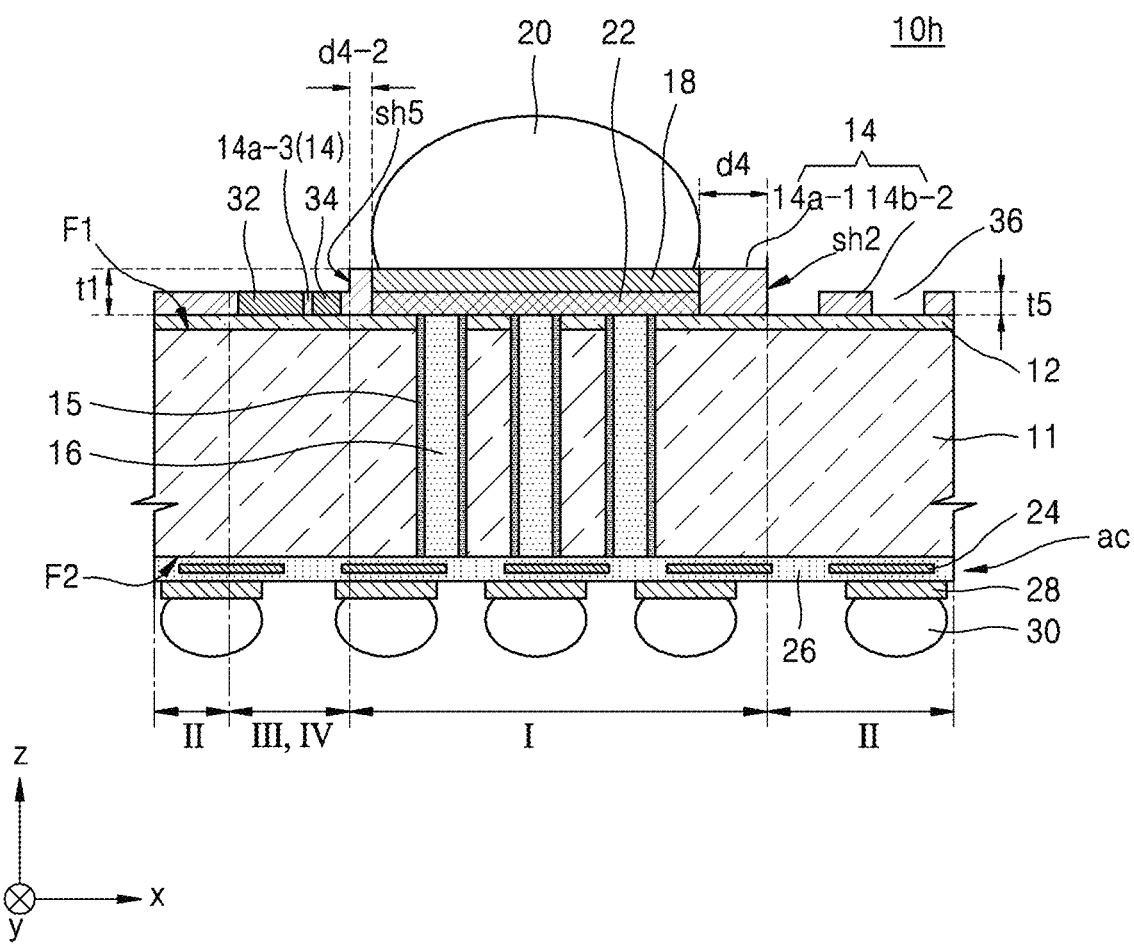
FIG. 8 is a partial cross-sectional view of a semiconductor chip according to some example embodiments of inventive concepts.

FIG. 8 is a partial cross-sectional view of a semiconductor chip 10h according to some example embodiments of inventive concepts.

In detail, the semiconductor chip 10h may be the same as the semiconductor chip 10g of FIG. 7, except that the semiconductor chip 10h includes the redistribution wiring and dummy regions III and IV having an exposed redistribution wiring pattern 32 and the dummy pattern 34 and an upper passivation layer 14b-2 having a recess portion 36 in the non-bump region II. Accordingly, descriptions about the same elements as those of the semiconductor chip 10g of FIG. 7 may be omitted or briefly provided.

The semiconductor chip 10h may include the redistribution wiring region III and the dummy region IV, in which the redistribution wiring pattern 32 and the dummy pattern 34 are formed on the lower passivation layer 12. The upper passivation layer 14 may be formed on the lower passivation layer 12 and cover the bump region I, the redistribution wiring and dummy regions III and IV, and the non-bump region II of the semiconductor substrate 11. The upper passivation layer 14a-3 in the redistribution wiring and dummy regions III and IV may be recessed to expose the redistribution wiring pattern 32 and the dummy pattern 34. Accordingly, a step sh5 is generated between the redistribution wiring and dummy regions III and IV and the bump region I.

The recess portion 36 may be formed in the upper passivation layers 14b-2 in the non-bump region II. The recess portion 36 in the non-bump region II may be formed when the recess in the upper passivation layer 14a-3 in the redistribution wiring and dummy regions III and IV is formed. A thickness t5 of the upper passivation layers 14a-3 and 14b-2 in the redistribution wiring and dummy regions III and IV and the non-bump region II may be thinner than the thickness t1 of the upper passivation layer 14a-1. In addition, the step sh2 is formed between the bump region I and the non-bump region II. The steps sh2 may be formed perpendicular in the z-axis direction, or may be inclined by a desired (and/or alternatively predetermined) angle.

Figure 9:
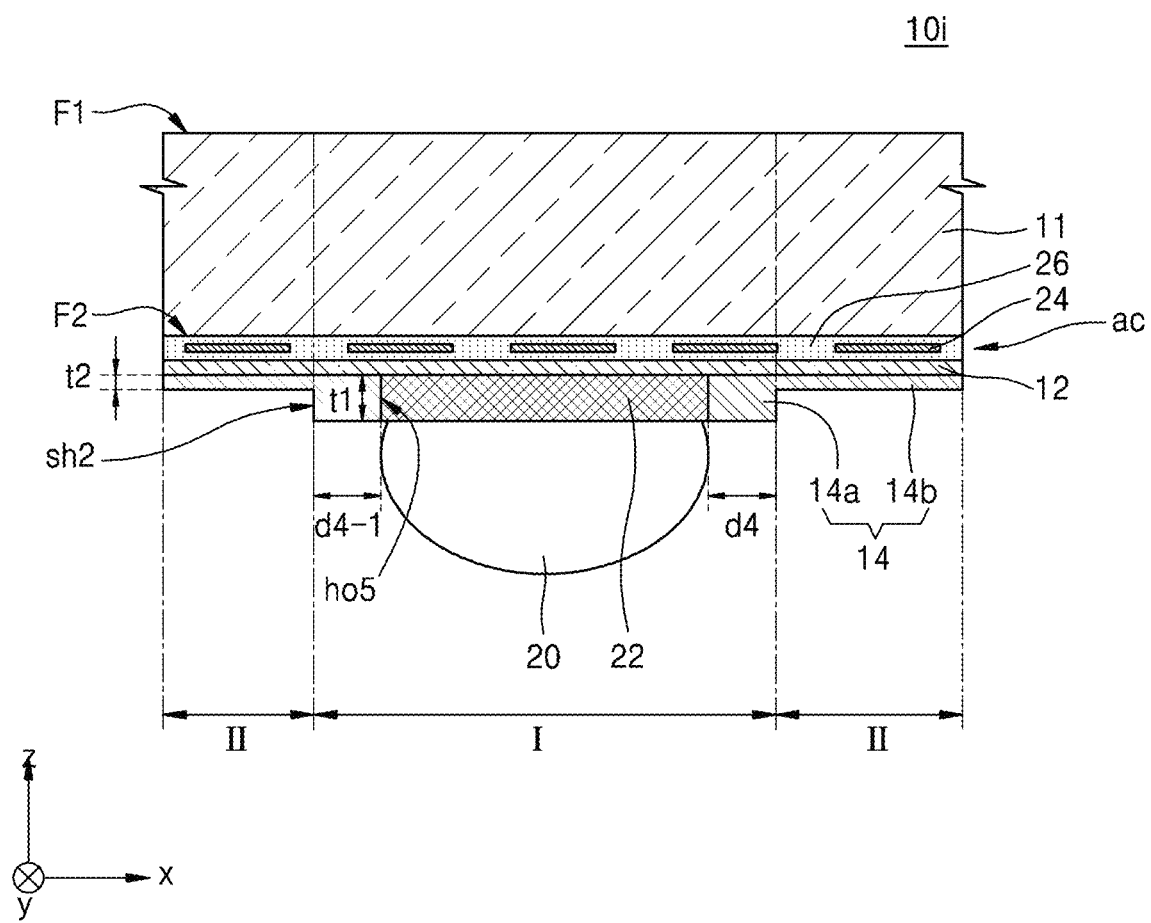
FIG. 9 is a partial cross-sectional view of a semiconductor chip according to some example embodiments of inventive concepts.

FIG. 9 is a partial cross-sectional view of a semiconductor chip 10i according to some example embodiments of inventive concepts.

In detail, the semiconductor chip 10i may be the same as the semiconductor chip 10e of FIG. 5, except that the bump pad 22, the bump 20, and the upper passivation layer 14 are formed on the second surface F2 of the semiconductor substrate 11 without forming a via. Accordingly, descriptions about the same elements as those of the semiconductor chip 10e of FIG. 5 may be omitted or briefly provided.

The semiconductor chip 10i may include the active region ac including the wiring layer 24 and the interlayer insulating layer 26 on the second surface F2 of the semiconductor substrate 11. In the semiconductor chip 10i, the upper passivation layer 14 may be formed on the lower passivation layer 12 on the second surface F2 of the semiconductor substrate 11. The bump pad 22 may be formed in a hole ho5 in the upper passivation layer 14. The bump pad 22 may be connected to a chip pad (not shown) formed on the second surface F2 of the semiconductor substrate 11. The bump region I may be obtained by forming the bump 20 on the bump pad 22.

The upper passivation layer 14 may be formed on the lower passivation layer 12 and cover the bump region I and the non-bump region II in the semiconductor substrate 11, except for the bump pad 22 and the bump 20. The upper passivation layer 14 may be divided as an upper passivation layer 14a in the bump region I and an upper passivation layer 14b in the non-bump region II.

In addition, the thickness t1 of the upper passivation layer 14a in the bump region I is thicker than the thickness t2 of the upper passivation layer 14b in the non-bump region II, and the step sh2 is generated between the bump region I and the non-bump region II. The step sh2 may be formed perpendicular in the z-axis direction, or may be inclined by a desired (and/or alternatively predetermined) angle.

Figure 10:
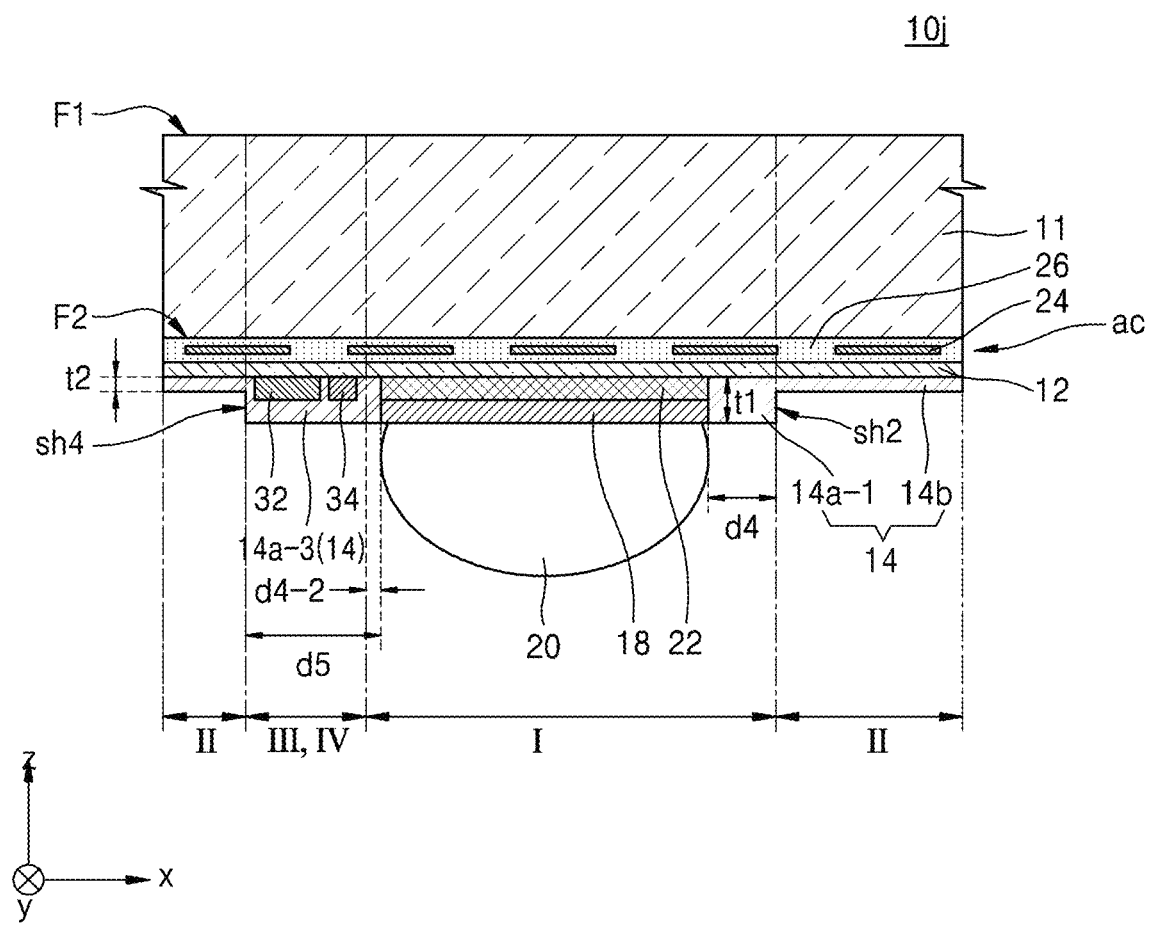
FIG. 10 is a partial cross-sectional view of a semiconductor chip according to some example embodiments of inventive concepts.

FIG. 10 is a partial cross-sectional view of a semiconductor chip 10j according to some example embodiments of inventive concepts.

In detail, the semiconductor chip 10j may be the same as the semiconductor chip 10g of FIG. 7, except that the bump pad 22, the barrier metal pad 18, the bump 20, the redistribution wiring pattern 32, the dummy pattern 34, and the upper passivation layer 14 are formed on the second surface F2 of the semiconductor substrate 11, without forming a via. Accordingly, descriptions about the same elements as those of the semiconductor chip 10g of FIG. 7 may be omitted or briefly provided.

The semiconductor chip 10j may include the active region ac including the wiring layer 24 and the interlayer insulating layer 26 on the second surface F2 of the semiconductor substrate 11. In the semiconductor chip 10j, the upper passivation layer 14 may be formed on the lower passivation layer 12 on the second surface F2 of the semiconductor substrate 11. The bump pad 22 and the barrier metal pad 18 may be formed in the upper passivation layer 14. The bump pad 22 may be connected to a chip pad (not shown) formed on the second surface F2 of the semiconductor substrate 11. The bump region I may be defined by forming the bump 20 on the bump pad 22 and the barrier metal pad 18.

The upper passivation layer 14 may be formed on the lower passivation layer 12 and cover the bump region I, the non-bump region II, and the redistribution wiring and dummy regions III and IV in the semiconductor substrate 11, except for the bump pad 22, the barrier metal pad 18, and the bump 20. The upper passivation layer 14 may be divided as the upper passivation layer 14a-1 in the bump region I, the upper passivation layer 14b in the non-bump region II, and the upper passivation layer 14a-3 in the redistribution wiring and dummy regions III and IV.

In addition, the thickness t1 of the upper passivation layers 14a-1 and 14a-3 in the bump region I and the redistribution wiring and dummy regions III and IV is thicker than the thickness t2 of the upper passivation layer 14b in the non-bump region II. The step sh4 is generated between the redistribution wiring and dummy regions III and IV, and the non-bump region II. The step sh2 is generated between the bump region I and the non-bump region II. The steps sh2 and sh4 may be formed perpendicular in the z-axis direction, or may be inclined by a desired (and/or alternatively predetermined) angle.

Figure 11:
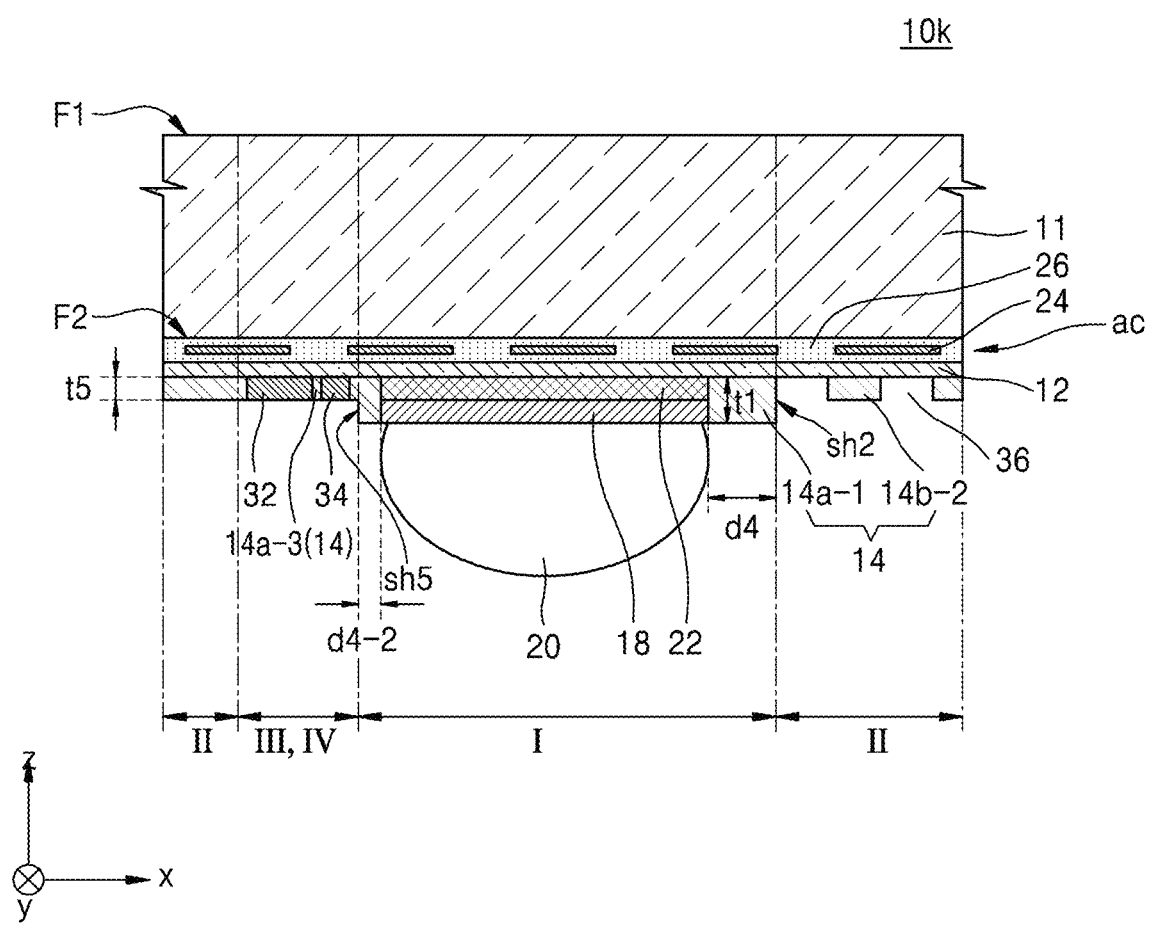
FIG. 11 is a partial cross-sectional view of a semiconductor chip according to some example embodiments of inventive concepts.

FIG. 11 is a partial cross-sectional view of a semiconductor chip 10k according to some example embodiments of inventive concepts.

In detail, the semiconductor chip 10k may be the same as the semiconductor chip 10h of FIG. 8, except that the bump pad 22, the barrier metal pad 18, the bump 20, the redistribution wiring pattern 32, the dummy pattern 34, and the upper passivation layer 14 are formed on the second surface F2 of the semiconductor substrate 11, without forming a via. Accordingly, descriptions about the same elements as those of the semiconductor chip 10h of FIG. 8 may be omitted or briefly provided.

The semiconductor chip 10k may include the active region ac including the wiring layer 24 and the interlayer insulating layer 26 on the second surface F2 of the semiconductor substrate 11. In the semiconductor chip 10k, the upper passivation layer 14 may be formed on the lower passivation layer 12 on the second surface F2 of the semiconductor substrate 11. The bump pad 22 and the barrier metal pad 18 may be formed in the upper passivation layer 14. The bump pad 22 may be connected to a chip pad (not shown) formed on the second surface F2 of the semiconductor substrate 11. The bump region I may be defined by forming the bump 20 on the bump pad 22 and the barrier metal pad 18.

The upper passivation layer 14 may be formed on the lower passivation layer 12 and cover the bump region I, the non-bump region II, and the redistribution wiring and dummy regions III and IV in the semiconductor substrate 11, except for the bump pad 22, the barrier metal pad 18, and the bump 20.

The upper passivation layer 14 may be divided as the upper passivation layer 14a-1 in the bump region I, the upper passivation layer 14b-2 in the non-bump region II, and the upper passivation layer 14a-3 in the redistribution wiring and dummy regions III and IV.

The thickness t1 of the upper passivation layer 14a-1 in the bump region I may be thicker than the thickness t5 of the upper passivation layers 14b-2 and 14a-3 in the non-bump region II and the redistribution wiring and dummy regions III and IV. The step sh5 is generated between the bump region I and the redistribution wiring and dummy regions III and IV. The step sh2 is generated between the bump region I and the non-bump region II. The steps sh2 and sh5 may be formed perpendicular in the z-axis direction, or may be inclined by a desired (and/or alternatively predetermined) angle.

Figure 12:
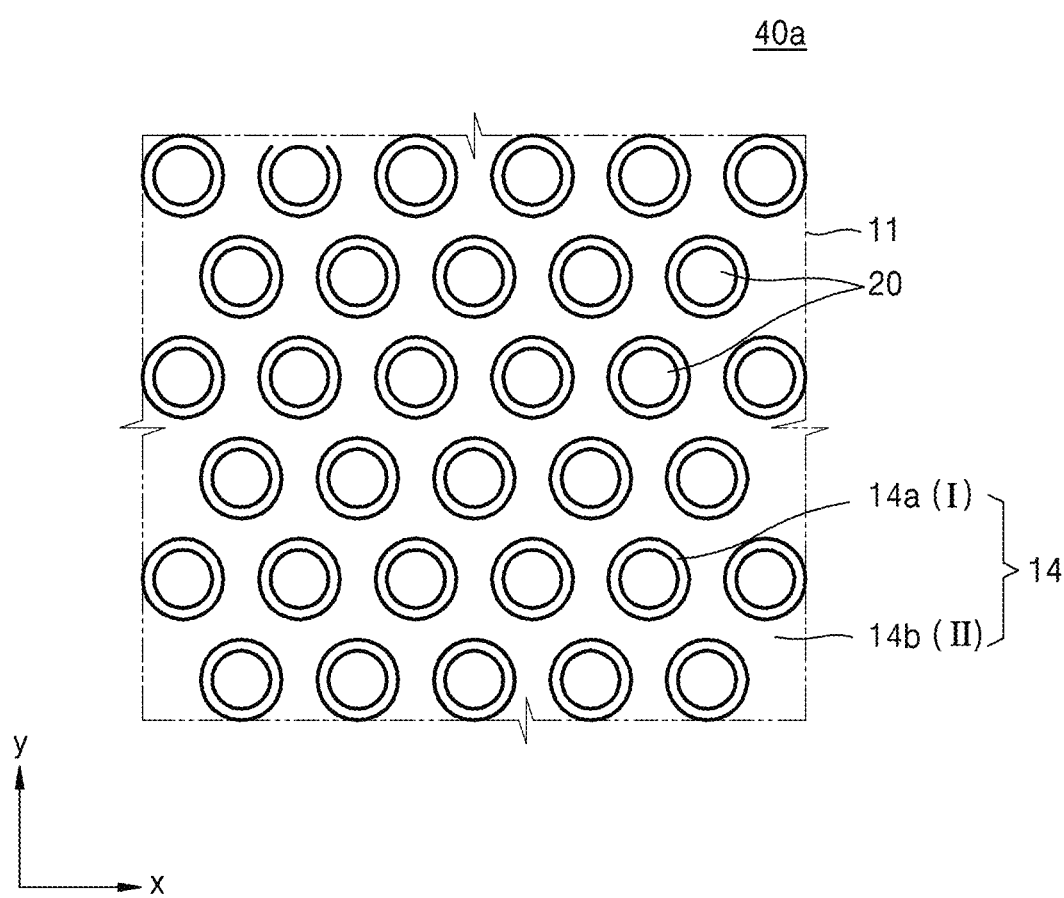
FIGS. 12 and 13 are plan views partially showing a semiconductor chip illustrating a relationship between thicknesses of a bump and a passivation layer, according to some example embodiments of inventive concepts.
Figure 13:
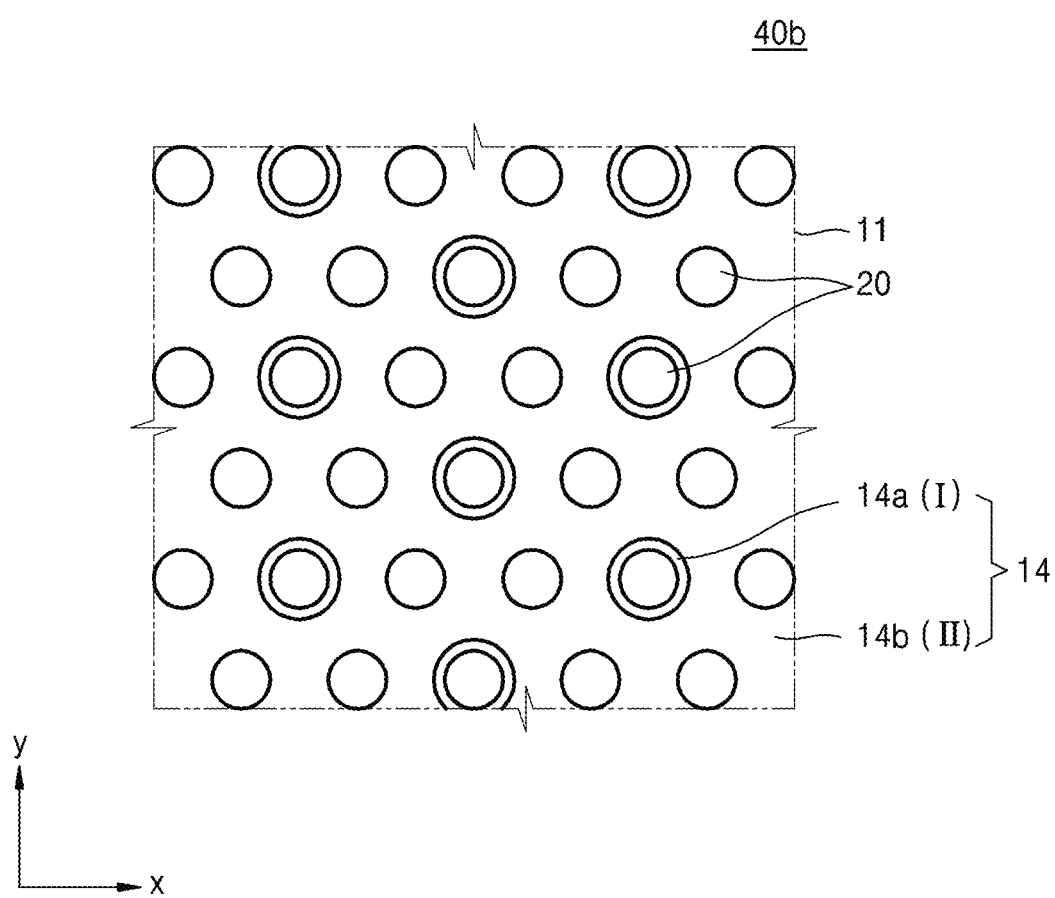

FIGS. 12 and 13 are plan views partially showing semiconductor chips 40a and 40b for illustrating a relationship between thicknesses of a bump and a passivation layer, according to some example embodiments of inventive concepts.

In detail, the semiconductor chips 40a and 40b illustrated in the partial plan views of FIGS. 12 and 13 may include bumps 20 spaced apart from one another on the semiconductor substrate 11. The bumps 20 may be arranged as a honeycomb shape as shown in FIGS. 12 and 13. The bumps 20 may be aligned in the horizontal (x direction) and the vertical direction (y direction).

The passivation layer 14a forming the bump region I may be formed around the bumps 20, as described above. In addition, the passivation layer 14b forming the non-bump region II is formed on the semiconductor substrate 11, except for the bump region I.

In the semiconductor chip 40a of FIG. 12, the thickness of the passivation layer 14a surrounding the plurality of bumps 20 is configured to be thicker than that of the passivation layer 14b in the non-bump region II. In the semiconductor chip 40b of FIG. 13, the thickness of the passivation layer 14a surrounding only some of the plurality of bumps 20 is configured to be thicker than that of the passivation layer 14b in the non-bump region II. As described above, the thickness of the passivation layer surrounding the bumps 20 on the semiconductor substrate 11 may be freely adjusted to control the warpage of the semiconductor chip.

Figure 14:
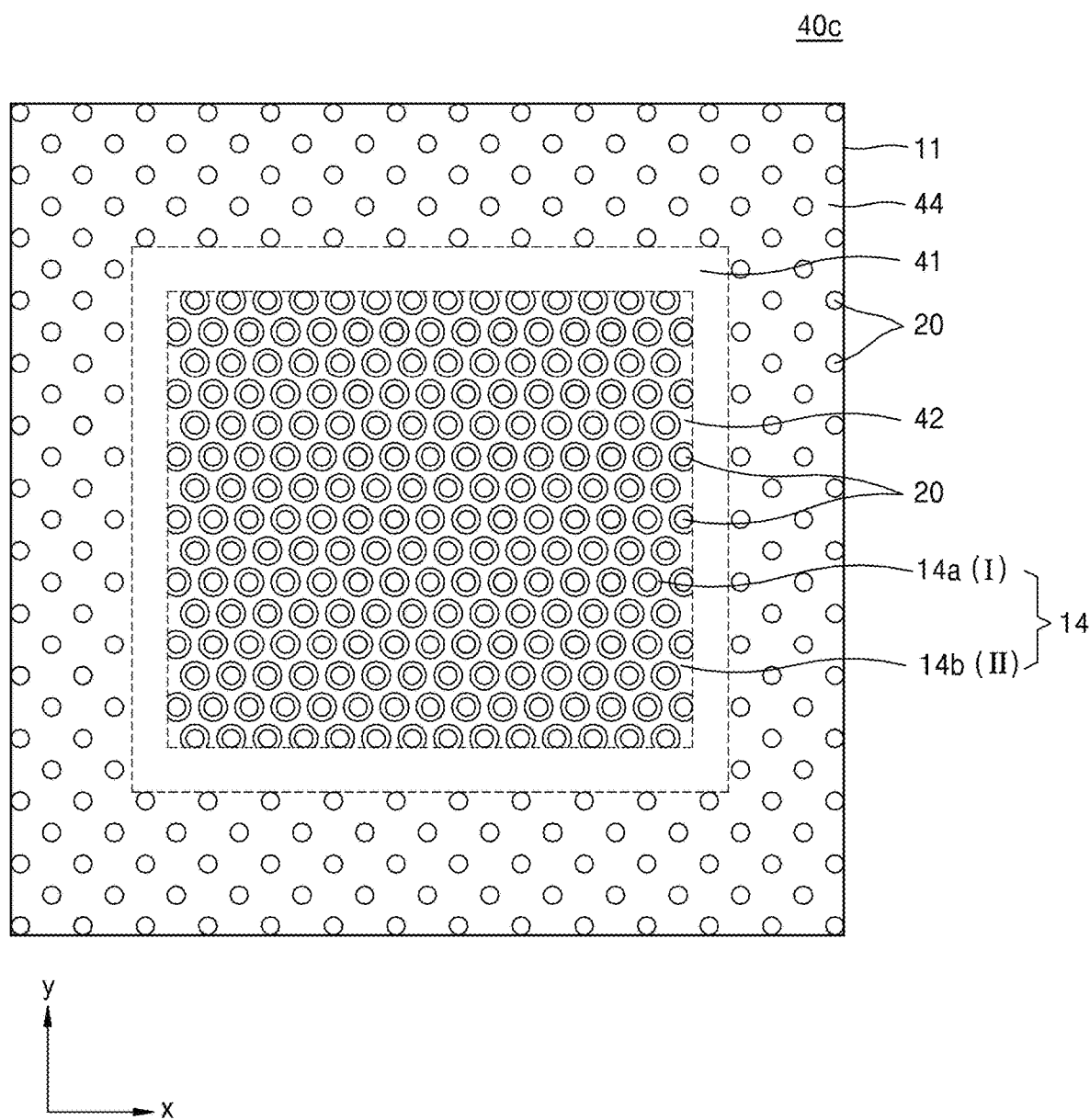
FIG. 14 is partially plan views of a semiconductor chip illustrating a relationship between thicknesses of a bump and a passivation layer, according to some example embodiments of inventive concepts.

FIG. 14 is a partial plan view of a semiconductor chip 40c for illustrating a relationship between thicknesses of a bump and a passivation layer, according to some example embodiments of inventive concepts.

In detail, the semiconductor chip 40c illustrated in the partial plan view of FIG. 14 may include the bumps 20 that are spaced from one another on the semiconductor substrate 11. The semiconductor substrate 11 may be divided as a center region 42 formed at a center portion thereof, and a peripheral region 44 surrounding the center region 42 and separated from the center region 42. An isolation region 41 may be located between the center region 42 and the peripheral region 44.

The passivation layer 14a forming the bump region I may be formed around the bumps 20, as described above. In addition, the passivation layer 14b forming the non-bump region II is formed on the semiconductor substrate 11, except for the bump region I.

In the partial plan view of FIG. 14, the thickness of the passivation layer 14a surrounding all of the plural bumps 20 formed on the center region 42 is thicker than that of the passivation layer 14b in the non-bump region II. As illustrated above with reference to FIG. 13, the thickness of the passivation layer 14a surrounding some of the plural bumps 20 formed on the center region 42 may be only configured to be thicker than that of the passivation layer 14b in the non-bump region II.

In the partial plan view of FIG. 14, the thickness of the passivation layer 14b surrounding the plurality of bumps formed on the peripheral region 44 is configured to be thinner than that of the passivation layer 14a in the bump region I. As described above, by freely adjusting the thickness of the passivation layers 14a and 14b surrounding the bumps 20 on the semiconductor substrate 11, the warpage of the semiconductor chip may be controlled.

Figure 15:
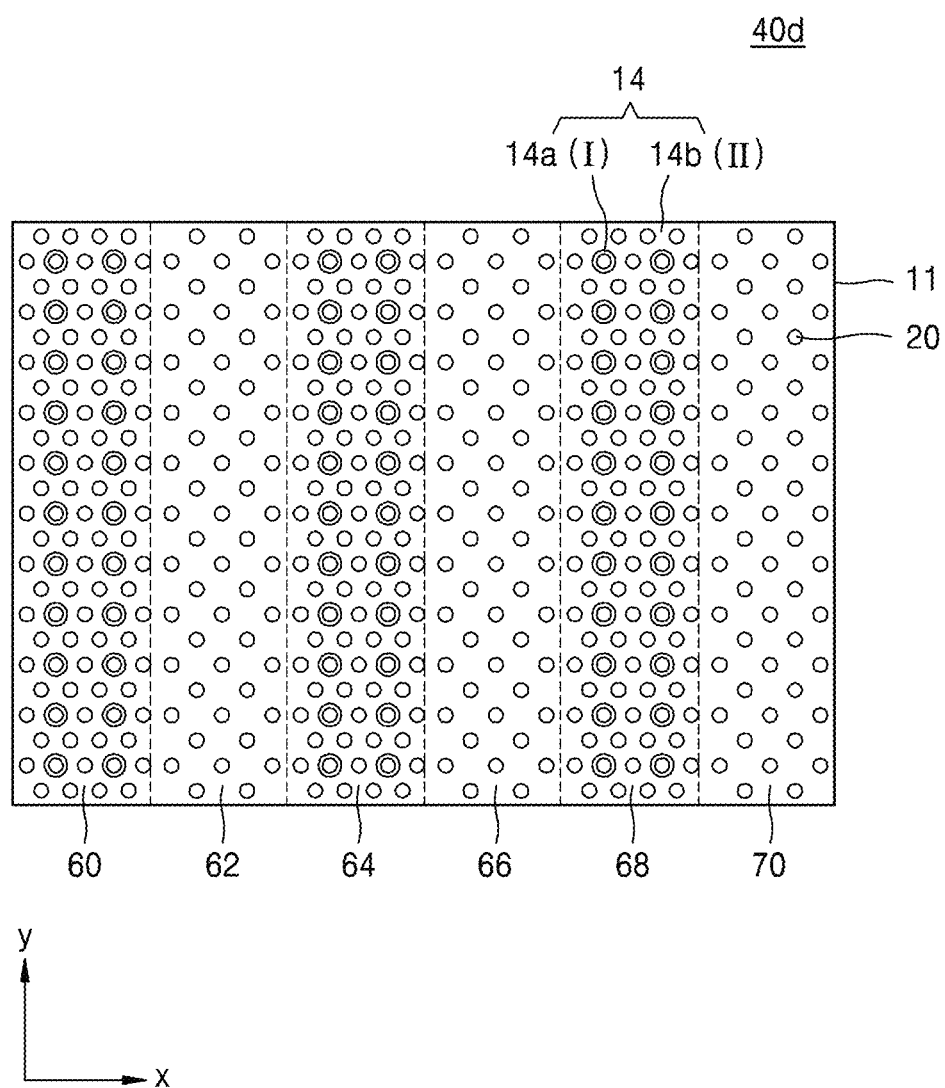
FIG. 15 is partially plan views of a semiconductor chip illustrating a relationship between thicknesses of a bump and a passivation layer, according to some example embodiments of inventive concepts.

FIG. 15 is a partial plan view of a semiconductor chip 40d for illustrating a relationship between thicknesses of a bump and a passivation layer, according to some example embodiments of inventive concepts.

In detail, the semiconductor chip 40d illustrated in the partial plan view of FIG. 15 may include the bumps 20 that are spaced from one another on the semiconductor substrate 11. The semiconductor substrate 11 may be divided as a plurality of sub-regions 60, 62, 64, 66, 68, and 70 that are partitioned from one side towards the other side.

The passivation layer 14a forming the bump region I may be formed around the bumps 20, as described above. In addition, the passivation layer 14b forming the non-bump region II is formed on the semiconductor substrate 11, except for the bump region I.

In the partial plan view of FIG. 15, the thickness of the passivation layer 14a surrounding some of the plural bumps 20 formed on at least one of the sub-regions 60, 62, 64, 66, 68, and 70 is thicker than that of the passivation layer 14b in the non-bump region II. As illustrated above with reference to FIG. 12, the thickness of the passivation layer 14a surrounding all of the plural bumps 20 formed on at least one of the sub-regions 60, 62, 64, 66, 68, and 70 may be thicker than that of the passivation layer 14b in the non-bump region II.

In the partial plan view of FIG. 15, the thickness of the passivation layer 14b surrounding the plurality of bumps 20 formed on at least one of the sub-regions 60, 62, 64, 66, 68, and 70 is thinner than that of the passivation layer 14a in the bump region I. As described above, by freely adjusting the thickness of the passivation layers 14a and 14b surrounding the bumps 20 on the semiconductor substrate 11, the warpage of the semiconductor chip may be controlled.

Figure 16:
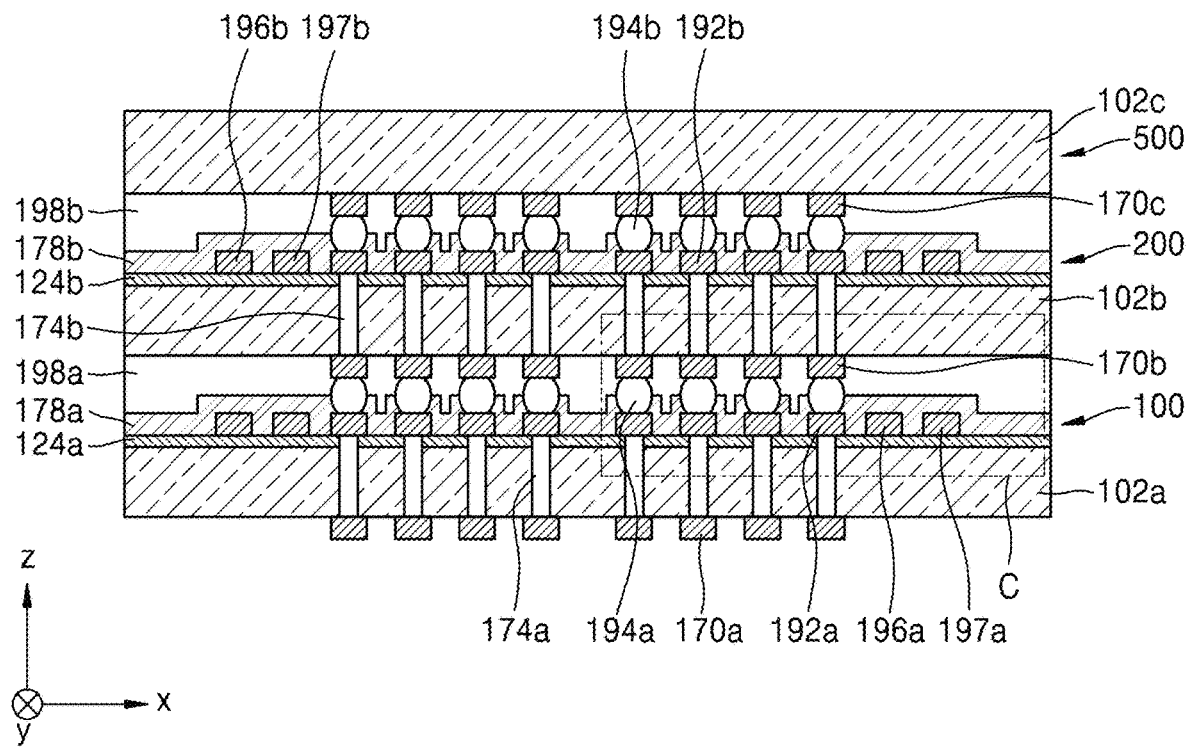
FIG. 16 is a cross-sectional view of a semiconductor package including a semiconductor chip according to some example embodiments of inventive concepts.
Figure 17:
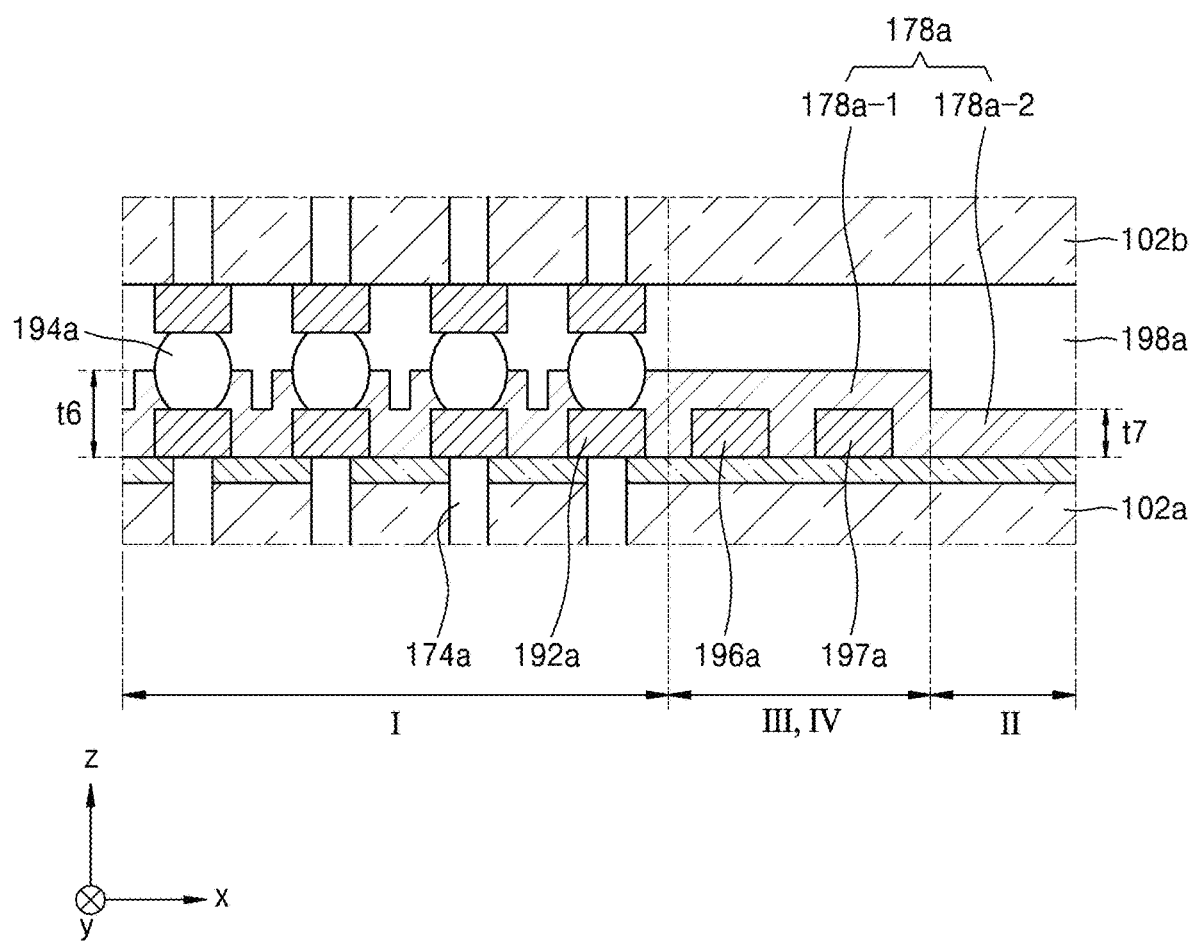
FIG. 17 is a partially enlarged view of FIG. 16.

FIG. 16 is a cross-sectional view of a semiconductor package 1000 including a semiconductor chip according to some example embodiments, and FIG. 17 is a partially enlarged view showing a part of FIG. 16.

In particular, FIG. 17 is an enlarged view of a part C in FIG. 16. The semiconductor package 1000 according to the embodiment of the inventive concept may include a first semiconductor chip 100, a second semiconductor chip 200, and an upper semiconductor chip 500. As described above, the first semiconductor chip 100, the second semiconductor chip 200, and the upper semiconductor chip 500 may each include the bump region I including bumps 194a and 194b, the redistribution wiring and dummy regions III and IV including redistribution wiring patterns 196a and 197a and dummy patterns 196b and 197b, and the non-bump region II not including a bump.

The first semiconductor chip 100 may include one or more first vias 174a penetrating through a first semiconductor substrate 102a. The first via 174a protrudes from an upper surface of the first semiconductor substrate 102a, and a side surface of the first via 174a may be surrounded by a lower passivation layer 124a formed on the upper surface of the first semiconductor substrate 102a.

The second semiconductor chip 200 is disposed on the first semiconductor chip 100. The second semiconductor chip 200 may be bonded to the first semiconductor chip 100 by a thermo-compression bonding process. The second semiconductor chip 200 includes one or more second via 174b arranged along the same vertical line as that of the first via 174a in the first semiconductor chip 100. The second via 174b protrudes from an upper surface of a second semiconductor substrate 102b, and a side surface of the second via 174b may be surrounded by a lower passivation layer 124b formed on the upper surface of the second semiconductor substrate 102b.

A plurality of bump pads 192a and 192b may be respectively formed on an upper surface of the first via 174a in the first semiconductor chip 100 and on an upper surface of the second via 174b in the second semiconductor chip 200. The bump pads 192a and 192b may include metal. The redistribution wiring patterns 196a and 197a and the dummy patterns 196b and 197b having the same height as that of the bump pads 192a and 192b may be formed on the upper surfaces of the first semiconductor chip 100 and the second semiconductor chip 200. The redistribution wiring patterns 196a and 197a and the dummy patterns 196b and 197b may include the same material as the bump pads 192a and 192b, for example, metal.

As shown in the enlarged view of FIG. 17, the bump pad 192a, the redistribution wiring pattern 196a, and the dummy pattern 197a of the first semiconductor chip 100 may be embedded or covered by the upper passivation layer 178a. Like the first semiconductor chip 100, the bump pad 192b, the redistribution wiring pattern 196b, and the dummy pattern 197b of the second semiconductor chip 200 may be covered or embedded by the second upper passivation layer 178b.

A thickness of a first upper passivation layer 178a-1 in the bump region I and the redistribution wiring and dummy regions III and IV of the first semiconductor chip 100 may be thicker than that of a first upper passivation layer 178a-2 in the non-bump region II. Likewise, a thickness of the second upper passivation layer 178b in the redistribution wiring and dummy regions III and IV of the second semiconductor chip 200 may be thicker than that of the second upper passivation layer 178b in the non-bump region II.

The upper semiconductor chip 500 is disposed on the second semiconductor chip 200. The upper semiconductor chip 500 may be bonded to the second semiconductor chip 200 by a thermo-compression bonding process. The upper semiconductor chip 500 may be thicker than the first semiconductor chip 100 and the second semiconductor chip 200 in thickness.

The second semiconductor chip 200 is electrically connected to the first semiconductor chip 100 via connection pads 170b and bumps 194a formed on a lower surface of the second semiconductor chip 200 and bump pads 192a formed on the upper surface of the first semiconductor chip 100. The upper semiconductor chip 500 is electrically connected to the second semiconductor chip 200 via connection pads 170c and bumps 194b formed on a lower surface of the upper semiconductor chip 500 and bump pads 192b formed on the upper surface of the second semiconductor chip 200.

The first semiconductor chip 100 and the second semiconductor chip 200 may be semiconductor chips of the same kind. The semiconductor package 1000 may include a first underfill material 198a filling a space between the first semiconductor chip 100 and the second semiconductor chip 200. The semiconductor package 1000 may include a second underfill material 198b filling a space between the second semiconductor chip 200 and the upper semiconductor chip 500. The first underfill material 198a and the second underfill material 198b may include a non-conductive material, for example, a non-conductive film (NCF).

Figure 18:
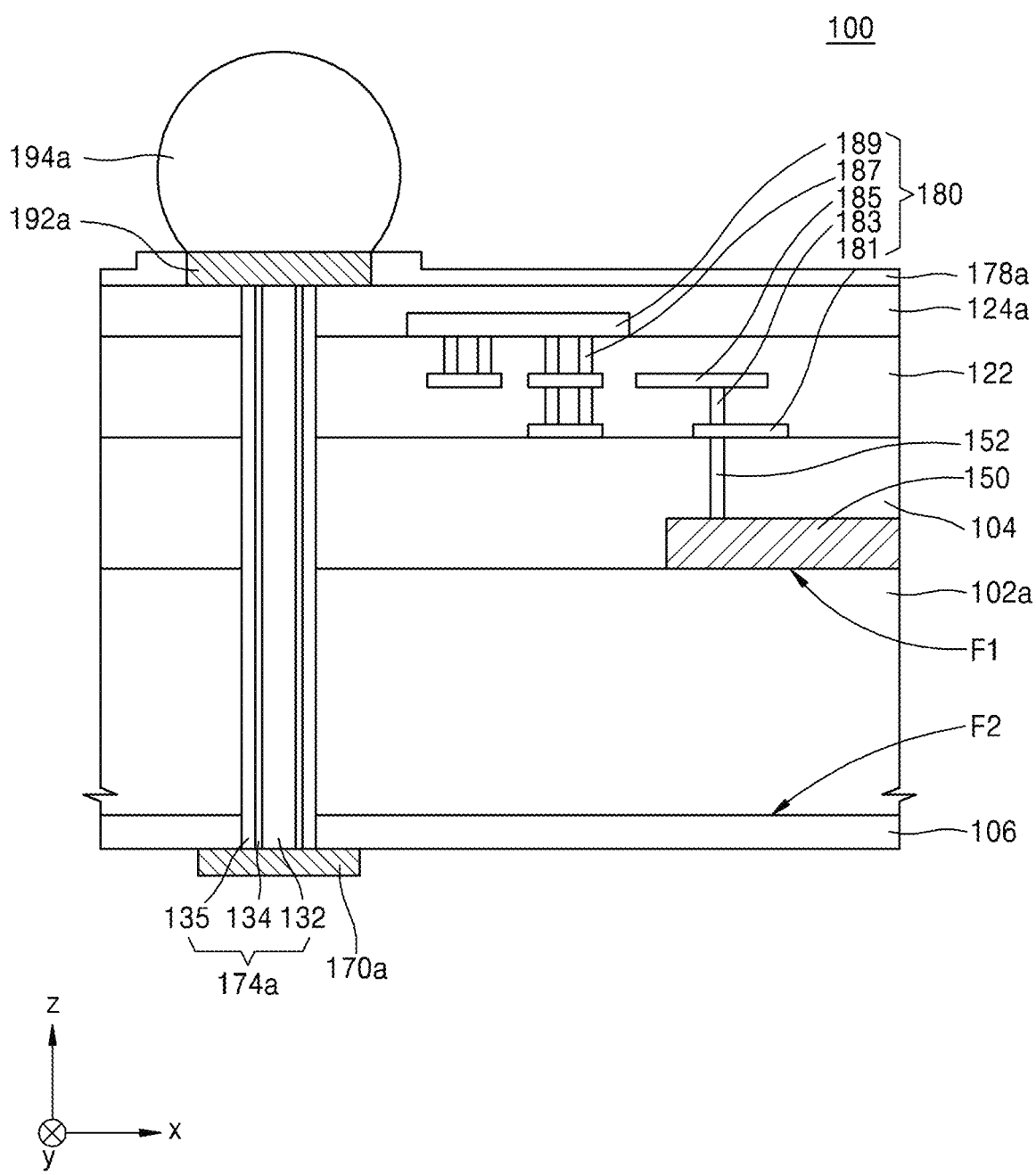
FIG. 18 is a partially enlarged cross-sectional view of the semiconductor chip of FIG. 16.

FIG. 18 is a partially enlarged cross-sectional view of the semiconductor package 1000 of FIG. 16.

In detail, FIG. 18 is a partially enlarged cross-sectional view of the first semiconductor chip 100 of FIG. 16. The first semiconductor chip 100 may include a semiconductor substrate 102a having the first surface F1 and the second surface F2, a lower interlayer insulating layer 104, an integrated circuit layer 150, vias 174a, an upper interlayer insulating layer 122, a lower passivation layer 124a, and a multi-layered wiring pattern 180.

The integrated circuit layer 150 may be formed on the first surface F1 of the semiconductor substrate 102a. Doping regions on which impurities are doped may be formed on an upper region of the semiconductor substrate 102a, which is adjacent to the first surface F1 where the integrated circuit layer 150 is formed. On the other hand, a lower region of the semiconductor substrate 102a adjacent to the second surface F2 may be an undoped region.

The lower interlayer insulating layer 104 may be formed over the first surface F1 of the semiconductor substrate 102a while covering the integrated circuit layer 150. The lower interlayer insulating layer 104 may isolate circuit devices in the integrated circuit layer 150 from one another. In addition, the lower interlayer insulating layer 104 may isolate circuit devices in the multi-layered wiring pattern 180 and the integrated circuit layer 150 from one another. The lower interlayer insulating layer 104 may have a stack structure including one or more selected from an oxide layer, a nitride layer, a low-k layer, and a high-k layer.

The integrated circuit layer 150 may be formed in the lower interlayer insulating layer 104 on the first surface F1 of the semiconductor substrate 102a, and may include a plurality of circuit devices. The integrated circuit layer 150 may include the circuit devices, for example, transistors and/or capacitors, according to a kind of the semiconductor chip 100. According to the structure of the integrated circuit layer 150, the first and second semiconductor chips 100 and 200 may function as memory devices or logic devices.

For example, the memory device may include dynamic random access memory (DRAM), static RAM (SRAM), a flash memory, electrically erasable and programmable read only memory (EEPROM), PRAM, MRAM, or RRAM. Such a structure of the semiconductor device is generally known in the art, and thus, does not restrict the scope of the inventive concept. Here, the reference numeral 152 may denote a metal contact that electrically connects the circuit devices in the integrated circuit layer 150 to above wiring patterns.

The upper interlayer insulating layer 122 may be provided on the lower interlayer insulating layer 104 to cover the multi-layered wiring pattern 180. The upper interlayer insulating layer 122 may separate wiring lines 181, 183, 185, and 187 from one another.

The lower passivation layer 124a may protect the upper surface of the semiconductor chip 100. The lower passivation layer 124a may include an oxide layer or a nitride layer, or a dual-layer including the oxide layer and the nitride layer. The upper passivation layer 178a may be formed on the lower passivation layer 124a. The upper passivation layer 178a may be thicker in thickness in the bump region including the bumps 194a, and may be thinner in thickness in a non-bump region excluding the bumps 194a.

The multi-layered wiring pattern 180 may be formed in the lower interlayer insulating layer 104 and the upper interlayer insulating layer 122, and may be electrically connected to the via 174a. The multi-layered wiring pattern 180 may include at least one layer of wiring lines, and vertical contacts connecting the wiring lines. The multi-layered wiring pattern 180 may be used to configure a desired (and/or alternatively predetermined) circuit by appropriately connecting the circuit devices in the integrated circuit layer 150 or to connect the circuit devices to an external product.

In some example embodiments, wiring lines of three layers, for example, the first wiring line 181, the second wiring line 185, and the third wiring line 189, may be arranged, and a first vertical plug 183 connecting the first wiring line 181 to the second wiring line 185 and a second vertical plug 187 connecting the second wiring line 185 to the third wiring line 189 may be formed. The first to third wiring lines 181, 185, and 189 and the first and second vertical plugs 183 and 187 in the multi-layered wiring pattern 180 may include the same material, for example, copper or aluminum, or may include different materials.

The via 174a in the first semiconductor chip 100 of FIG. 18 may include a via insulating layer 135, a barrier metal layer 134, and a wiring metal layer 132. The barrier metal layer 134 may include a stack structure having one or more selected from titanium (Ti), tantalum (Ta), titanium nitride (TiN), and tantalum nitride (TaN).

The wiring metal layer 132 may include one or more selected from aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The wiring metal layer 132 may have a stack structure including one or more selected from tungsten (W), aluminum (Al), and copper (Cu).

The via 174a penetrates through the interlayer insulating layers 104 and 122, the lower passivation layer 124a, and the semiconductor substrate 102a, and an end of the via 174a may be exposed from the second surface F2 of the semiconductor substrate 102a. The via 174a may protrude from the second surface F2 of the semiconductor substrate 102a to be easily connected to the connection pad 170a.

The bump pad 192a and the bump 194a may be formed on the via 174a. The bump 194a may be connected to the via 174a, and may be connected to the multi-layered wiring pattern 180. A protective layer 106 may be formed on the second surface F2 of the semiconductor substrate 102a in order to protect devices.

Figure 19:
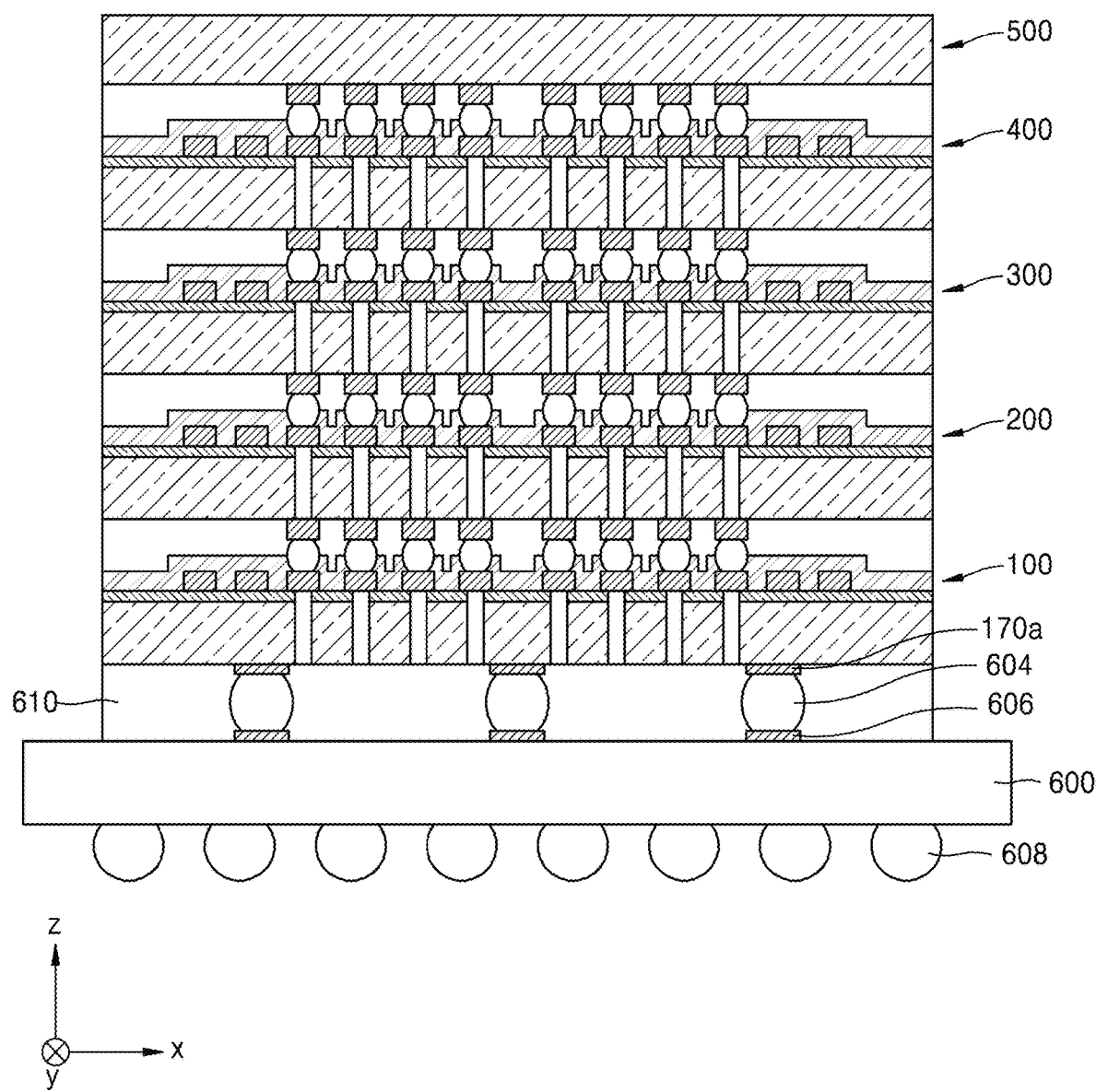
FIG. 19 is a cross-sectional view of a semiconductor package including a semiconductor chip according to some example embodiments of inventive concepts.

FIG. 19 is a cross-sectional view of a semiconductor package 1000-1 including a semiconductor chip according to some example embodiments of inventive concepts.

In detail, the semiconductor package 1000-1 according to the embodiment may be the same as the semiconductor package 1000 of FIG. 16, except that the semiconductor package 1000-1 is mounted on a printed circuit board 600. In FIG. 19, the reference numeral 610 may be an adhesive layer.

The semiconductor package 1000-1 may include first to fourth semiconductor chips 100, 200, 300, and 400 and the upper semiconductor chip 500 mounted on the printed circuit board 600. Since the first to fourth semiconductor chips 100 to 400 are similar to the semiconductor chips 100 and 200 illustrated with reference to FIGS. 16 to 18, descriptions about them may be omitted or briefly provided. The upper semiconductor chip 500 is similar to the upper semiconductor chip 500 of FIG. 16, and thus, descriptions thereof may be omitted.

The first semiconductor chip 100 may be electrically connected to the printed circuit board 600 via connection pads 170a formed on a lower surface thereof, and connection terminal 604 and substrate pads 606. External connection terminals 608 may be formed on a lower surface of the printed circuit board 600.

Figure 20:
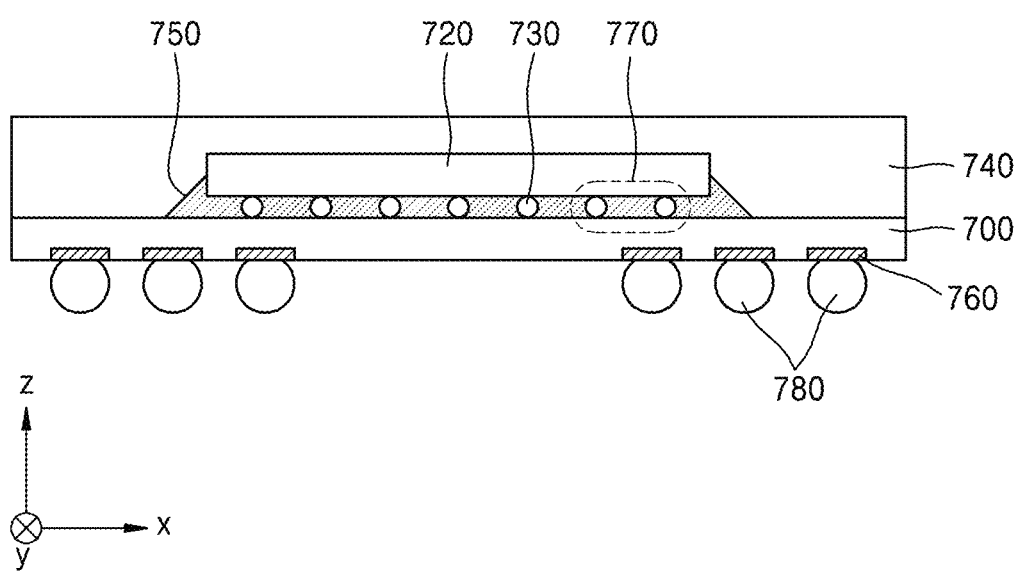
FIG. 20 is a cross-sectional view of a semiconductor package including a semiconductor chip according to some example embodiments of inventive concepts.
Figure 21:
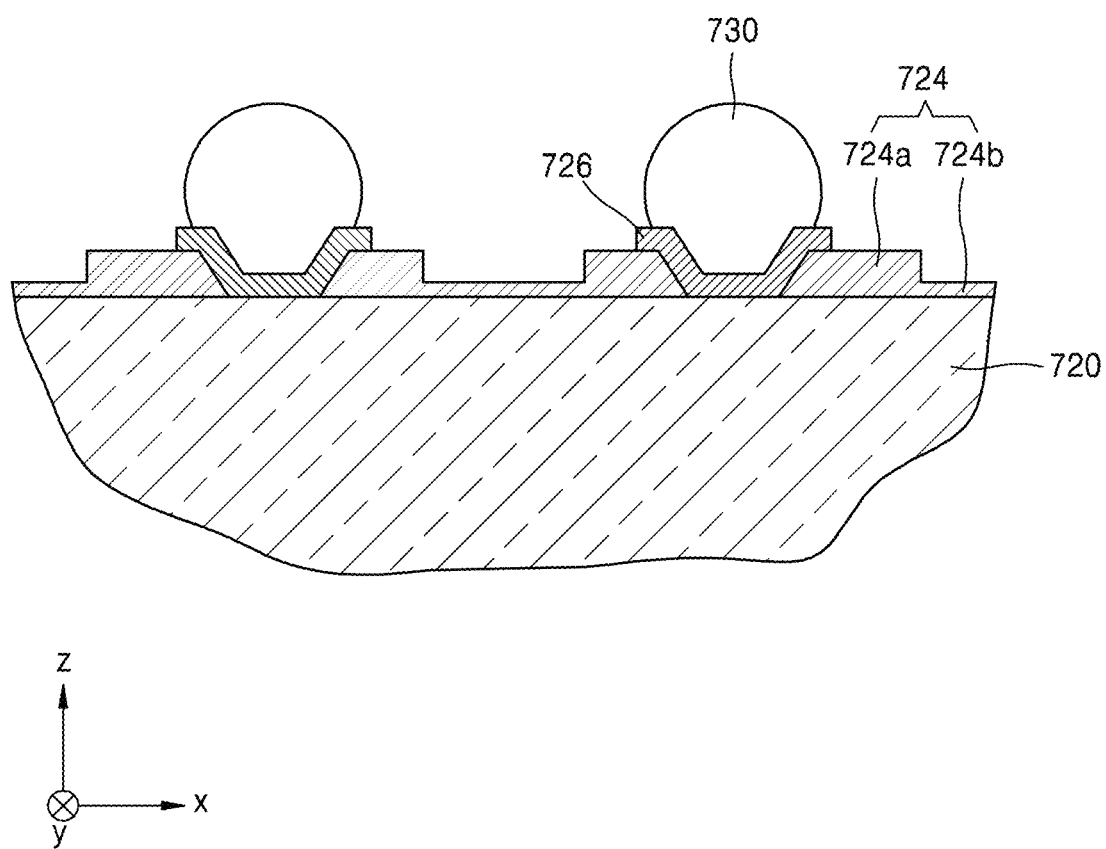
FIG. 21 is a partially enlarged view of FIG. 20.

FIG. 20 is a cross-sectional view of a semiconductor package 1000-2 including a semiconductor chip according to some example embodiments, and FIG. 21 is a partially enlarged view showing a part of FIG. 20.

In detail, the semiconductor package 1000-2 may have a structure, in which a semiconductor chip 720 is directly mounted on a printed circuit board 700 via bumps 730. The semiconductor package 1000-2 may selectively include an underfill unit 750 filling a space between the semiconductor chip 720 and the printed circuit board 700. The semiconductor package 1000-2 may selectively further include an encapsulation unit 740 for encapsulating the semiconductor chip 720 mounted on the printed circuit board 700, and external connection terminals 780 for extending functions of the semiconductor chip 720 to outside at a lower portion of the printed circuit board 700. The external connection terminals 780 may be formed on the substrate pads 760.

The bumps 730 may denote conductive protrusions that are used to bond the semiconductor chip 720 to the printed circuit board 700 by a tape automated bonding (TAB) process or a flip-chip bonding process. The bumps 730 may be used as conductive protrusions for directly connecting a ball grid array (BGA), a chip scale package (CSP), etc. to the printed circuit board 700. If the bumps 730 are solder bumps, the bump 730 may maintain a ball shape due to a surface tension effect after a reflow process, but if the bumps 730 are gold (Au) bumps, the bump 730 may be formed as square pillars that are plated. The bump 730 may include a metal material such as solder, gold (Au), and copper (Cu).

FIG. 21 may be an enlarged view of the reference numeral 770 in FIG. 20. As shown in FIG. 21, the bumps 730 may be formed on bump pads 726 formed in a passivation layer 724 on the semiconductor chip 720. The passivation layer 724 may be divided as a passivation layer 724a in the bump region including the bumps 730 and a peripheral portion, and a passivation layer 724b in a non-bump region excluding the bump region.

The passivation layer 724a in the bump region is thicker in thickness than the passivation layer 724b in the non-bump region, and a step may be generated between the bump region and the non-bump region. Accordingly, by reducing the thickness of the passivation layer in the non-bump region, except for the region surrounding the bumps 730, generation of warpage in the semiconductor chip 720 or the semiconductor package 1000-2 may be restricted.

Figure 22:
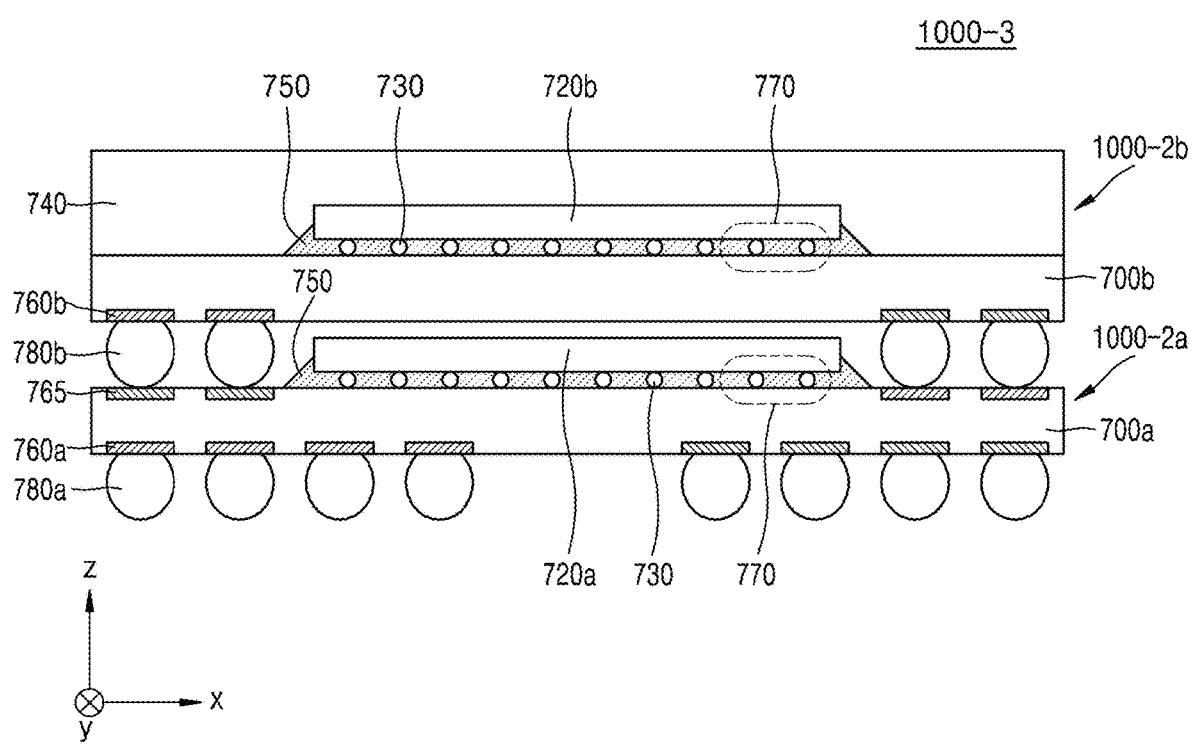
FIG. 22 is a cross-sectional view of a semiconductor package including a semiconductor chip according to some example embodiments of inventive concepts.

FIG. 22 is a cross-sectional view of a semiconductor package 1000-3 including a semiconductor chip according to some example embodiments of inventive concepts.

In detail, the semiconductor package 1000-3 of FIG. 22 may be a system-in-package (SIP) of a package-on-package (POP) type, in which a plurality of the semiconductor packages 1000-2 of FIG. 20 are mounted. Accordingly, descriptions about the same elements as those shown in FIGS. 20 and 21 will be omitted or briefly provided.

The semiconductor package 1000-3 may be a package, in which a second semiconductor package 1000-2*b* is stacked on a first semiconductor package 1000-2*a*. The first semiconductor package 1000-2*a* may include a first semiconductor chip 720*a* mounted on a first printed circuit board 700*a*. The second semiconductor package 1000-2*b* may include a second semiconductor chip 720*b* mounted on a second printed circuit board 700*b*. The first and second semiconductor chips 720*a* and 720*b* may be respectively connected to the first and second printed circuit boards 700*a* and 700*b* via bumps 730. The bumps 730 are formed on the first and second semiconductor chips 720*a* and 720*b*, and have the same cross-section as that of FIG. 21, and thus, descriptions thereof are omitted.

The second semiconductor package 1000-2*b* may be connected to upper connection pads 765 of the first printed circuit board 700*a* via lower connection pads 760*b* and connection terminals 780*b* formed on a lower surface of the second printed circuit board 700*b*. The first semiconductor package 1000-2*a* may be connected to an external device via lower connection pads 760*a* and connection terminals 780*a* formed on a lower surface of the first printed circuit board 700*a*.

While some example embodiments of inventive concepts have been particularly shown and described, it will be understood that various changes in form and details may be made therein without departing from the spirit and scope of the following claims.

What is claimed is:

1. A semiconductor chip comprising:
   a semiconductor substrate including a bump region, a non-bump region, a redistribution wiring region, and a dummy region;
   a bump on the bump region, the non-bump region having no bump;
   at least one of a redistribution wiring pattern on the redistribution wiring region and a dummy pattern on the dummy region;
   a passivation layer on the bump region, the redistribution wiring region, the dummy region, and the non-bump region of the semiconductor substrate, a thickness of the passivation layer at the bump region being thicker than a thickness of the passivation layer at the non-bump region, and the passivation layer including a step between the bump region and the non-bump region;
   a bump pad on the bump region; and
   a barrier metal pad on the bump pad, wherein
   the bump is on the barrier metal pad,
   the passivation layer defines a pad hole that exposes the bump pad,
   the barrier metal pad is on the bump pad in the pad hole,
   at least a portion of the barrier metal pad is within the pad hole, and
   the passivation layer is recessed, with respect to a top surface of the passivation layer, in the redistribution wiring region and the dummy region.

2. The semiconductor chip of claim 1, wherein
   the semiconductor substrate includes a first surface and a second surface opposite the first surface, and
   one of the first surface and the second surface of the semiconductor substrate includes an active region.

3. The semiconductor chip of claim 2, further comprising:
   a connection pad connected to the second surface of the semiconductor substrate,
   wherein the bump and the passivation layer are on the first surface of the semiconductor substrate.

4. The semiconductor chip of claim 2, wherein
   the bump and the passivation layer are connected to the second surface of the semiconductor substrate.

5. A semiconductor chip comprising:
   a semiconductor substrate including a bump region, a non-bump region, a redistribution wiring region, and a dummy region;
   a bump on the bump region, the non-bump region having no bump;
   at least one of a redistribution wiring pattern on the redistribution wiring region and a dummy pattern on the dummy region;
   a passivation layer on the bump region, the redistribution wiring region, the dummy region, and the non-bump region of the semiconductor substrate, a thickness of the passivation layer at the bump region being thicker than a thickness of the passivation layer at the non-bump region, and the passivation layer including a step between the bump region and the non-bump region;
   a via in the bump region; and
   a barrier metal pad on the via, wherein
   the bump is on the barrier metal pad,
   the passivation layer surrounds a side surface of the barrier metal pad,
   the side surface of the barrier metal pad is between a top surface of the barrier metal pad and a bottom surface of the barrier metal pad, and
   the passivation layer is recessed, with respect to a top surface of the passivation layer, in the redistribution wiring region and the dummy region.

6. The semiconductor chip of claim 5, wherein
   the passivation layer defines a via hole exposing the via,
   the barrier metal pad is on the via in the via hole, and
   the barrier metal pad is in the via hole.

7. The semiconductor chip of claim 5, further comprising:
   a bump pad on the via, and
   a barrier metal pad on the bump pad,
   wherein the bump is on the barrier metal pad, and the via penetrates through the semiconductor substrate at the bump region.

8. The semiconductor chip of claim 7, wherein the passivation layer defines a pad hole that exposes the bump pad, and the barrier metal pad is on the bump pad in the pad hole.

9. The semiconductor chip of claim 7, further comprising:
   a plurality of bump pads, wherein the semiconductor substrate includes a plurality of the vias, the plurality of bump pads include the bump pad, and
   the plurality of bump pads are on the plurality of vias.

10. The semiconductor chip of claim 9, wherein
    the semiconductor substrate includes a first surface opposite a second surface, and one of first surface and the second surface of the semiconductor substrate includes the an active region.

11. The semiconductor chip of claim 10, further comprising:
    a connection pad on the second surface of the semiconductor substrate, wherein
    the bump and the passivation layer are on the first surface of the semiconductor substrate.

12. The semiconductor chip of claim 11, wherein
    the semiconductor substrate includes a plurality of the vias,
    the plurality of vias include the via, and
    the connection pad is connected to the plurality of vias.

13. The semiconductor chip of claim 10, wherein the bump and the passivation layer are on the second surface of the semiconductor substrate.

14. A semiconductor chip comprising:
- a semiconductor substrate including a first surface opposite a second surface, the semiconductor substrate including a bump region, a non-bump region, a redistribution wiring region, and a dummy region;
- a bump pad on the first surface of the semiconductor substrate in the bump region;
- a bump on the bump pad, the non-bump region having no bump;
- at least one of a redistribution wiring pattern on the redistribution wiring region and a dummy pattern on the dummy region, the at least one of the redistribution wiring pattern and the dummy pattern being on the first surface or the second surface of the semiconductor substrate; and
- a passivation layer covering the bump region, the non-bump region, and the redistribution wiring and dummy regions on the first surface or the second surface of the semiconductor substrate, a thickness of the passivation layer at the bump region being thicker than a thickness of the passivation layer at the non-bump region, and the passivation layer including a step between the bump region and the non-bump region, wherein the passivation layer is recessed, with respect to a top surface of the passivation layer, in the redistribution wiring region and the dummy region.

15. The semiconductor chip of claim 14, wherein the passivation layer exposes the redistribution wiring pattern and the dummy pattern.

16. The semiconductor chip of claim 14, wherein
- a thickness of the passivation layer in the redistribution wiring and dummy region is equal to a thickness of the passivation layer in the non-bump region, and
- the passivation layer includes a third step between the bump region and the at least one of the redistribution wiring and dummy regions.

17. The semiconductor chip of claim 14, wherein the redistribution wiring and dummy regions contact the bump region.

18. The semiconductor chip of claim 14, wherein the passivation layer includes a recess portion in the non-bump region.

19. The semiconductor chip of claim 14, further comprising:
- a connection pad on the second surface of the semiconductor substrate, wherein
- the bump and the passivation layer are on the first surface of the semiconductor substrate.

* * * * *

UNITED STATES PATENT AND TRADEMARK OFFICE
CERTIFICATE OF CORRECTION

| | | |
|---|---|---|
| PATENT NO. | : 11,798,906 B2 | Page 1 of 1 |
| APPLICATION NO. | : 17/551548 | |
| DATED | : October 24, 2023 | |
| INVENTOR(S) | : Jeong-gi Jin et al. | |

It is certified that error appears in the above-identified patent and that said Letters Patent is hereby corrected as shown below:

On the Title Page

Should read:
(*) Notice: Subject to any disclaimer, the term of this patent is extended or adjusted under 35 U.S.C. 154(b) by 0 days.
-- This patent is subject to a terminal disclaimer. --

Signed and Sealed this
Fourth Day of November, 2025

John A. Squires
*Director of the United States Patent and Trademark Office*